(12) United States Patent
Svensson et al.

(10) Patent No.: US 8,614,798 B2
(45) Date of Patent: Dec. 24, 2013

(54) PATTERN GENERATORS, CALIBRATION SYSTEMS AND METHODS FOR PATTERNING WORKPIECES

(71) Applicant: Micronic Mydata AB, Taby (SE)

(72) Inventors: Anders Svensson, Stockholm (SE); Fredrik Jonsson, Stockholm (SE)

(73) Assignee: Micronic Mydata AB, Taby (SE)

( * ) Notice: Subject to any disclaimer, the term of this patent is extended or adjusted under 35 U.S.C. 154(b) by 0 days.

(21) Appl. No.: 13/910,712

(22) Filed: Jun. 5, 2013

(65) Prior Publication Data

US 2013/0265589 A1    Oct. 10, 2013

Related U.S. Application Data

(62) Division of application No. 13/064,067, filed on Mar. 3, 2011.

(60) Provisional application No. 61/282,584, filed on Mar. 3, 2010.

(51) Int. Cl.
*G01B 11/30* (2006.01)
*G01B 11/14* (2006.01)

(52) U.S. Cl.
USPC .......................................... 356/620; 356/614

(58) Field of Classification Search
USPC ................ 356/237.1–241.6, 242.1–243.8, 356/426–431, 600–640
See application file for complete search history.

(56) References Cited

U.S. PATENT DOCUMENTS

| | | | | |
|---|---|---|---|---|
| 4,371,264 A * | 2/1983 | Lacombat et al. | ............ | 356/509 |
| 4,545,684 A * | 10/1985 | Kuroki et al. | ................ | 356/400 |
| 4,557,599 A * | 12/1985 | Zimring | ..................... | 356/243.1 |
| 5,214,486 A * | 5/1993 | DeWitt | ...................... | 356/243.6 |
| 5,468,969 A * | 11/1995 | Itoh et al. | ................. | 250/492.23 |
| 5,672,520 A * | 9/1997 | Natsume | ........................ | 356/401 |
| 6,198,527 B1 * | 3/2001 | Nishi | ............................... | 355/53 |
| 6,342,735 B1 * | 1/2002 | Colelli et al. | ................. | 257/797 |
| 6,355,994 B1 * | 3/2002 | Andeen et al. | .................. | 310/15 |
| 6,980,876 B2 * | 12/2005 | Lin et al. | ....................... | 700/121 |
| 7,480,892 B2 * | 1/2009 | Chiu et al. | ...................... | 716/50 |
| 2010/0235127 A1 | 9/2010 | Kwan | | |

FOREIGN PATENT DOCUMENTS

| | | |
|---|---|---|
| DE | 10 2007 046 927 | 4/2009 |
| WO | WO 2010/063826 | 6/2010 |

OTHER PUBLICATIONS

Written Opinion, issued in International Application No. PCT/EP2011/053241, dated Jun. 22, 2012.
International Search Report and Written Opinion issued in International Application No. PCT/EP2011/053241, dated Jun. 7, 2011.

* cited by examiner

*Primary Examiner* — Gregory J Toatley
*Assistant Examiner* — Jarreas C Underwood
(74) *Attorney, Agent, or Firm* — Harness, Dickey & Pierce, P.L.C.

(57) ABSTRACT

A pattern generator includes: a writing tool and a calibration system. The writing tool is configured to generate a pattern on a workpiece arranged on a stage. The calibration system is configured to determine a correlation between a coordinate system of the writing tool and a coordinate system of a calibration plate on one of the stage and the workpiece. The calibration system is also configured to determine the correlation at least partly based on an optical correlation signal, or pattern, in a form of at least one optical beam being reflected from at least one reflective pattern on the surface of the calibration plate.

22 Claims, 31 Drawing Sheets

LDI y-mark detection

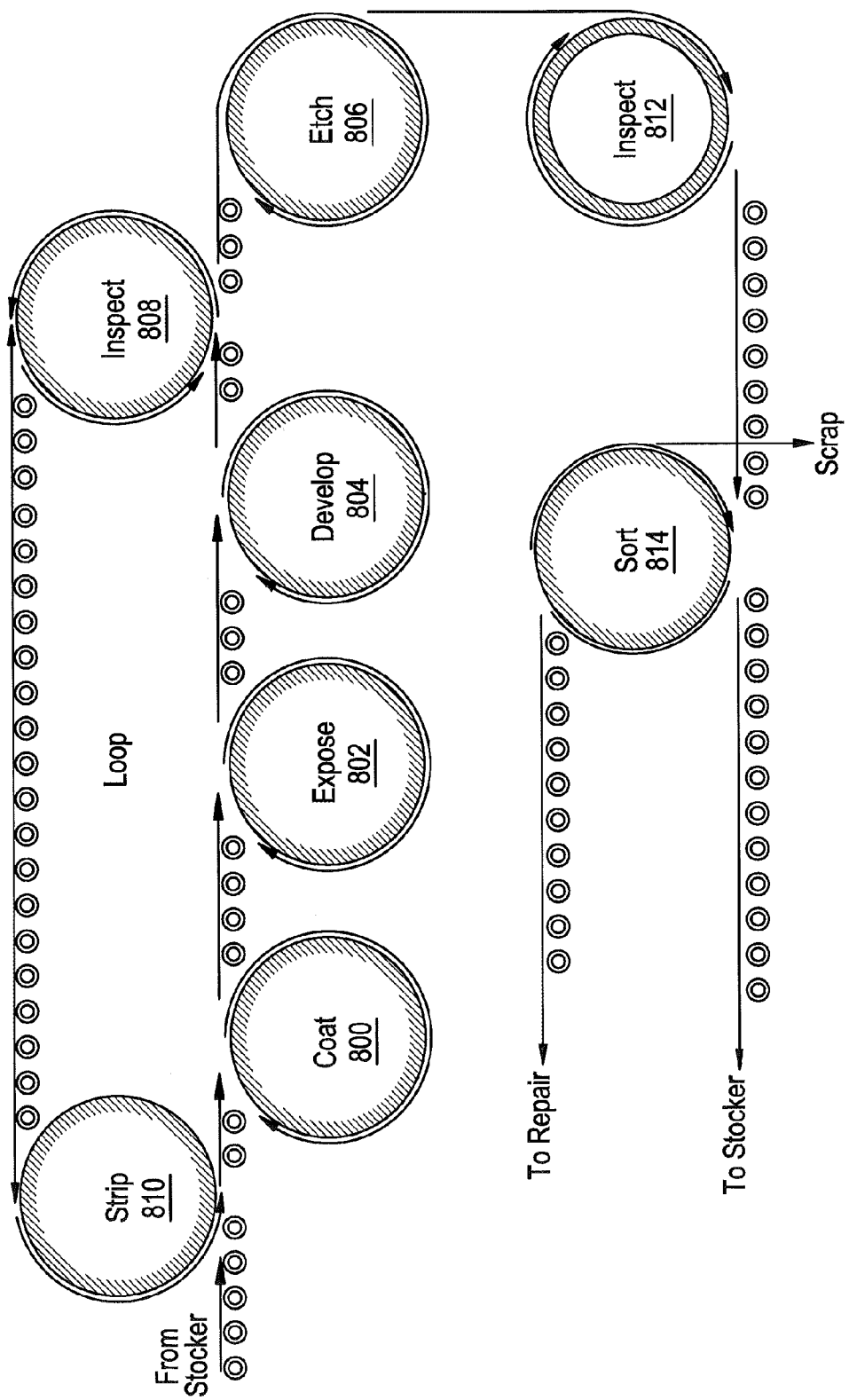

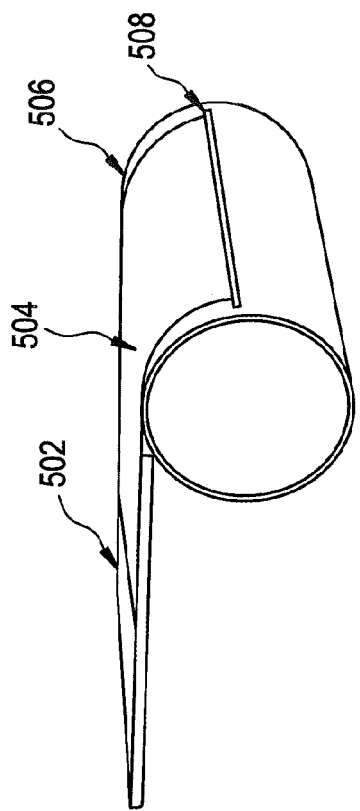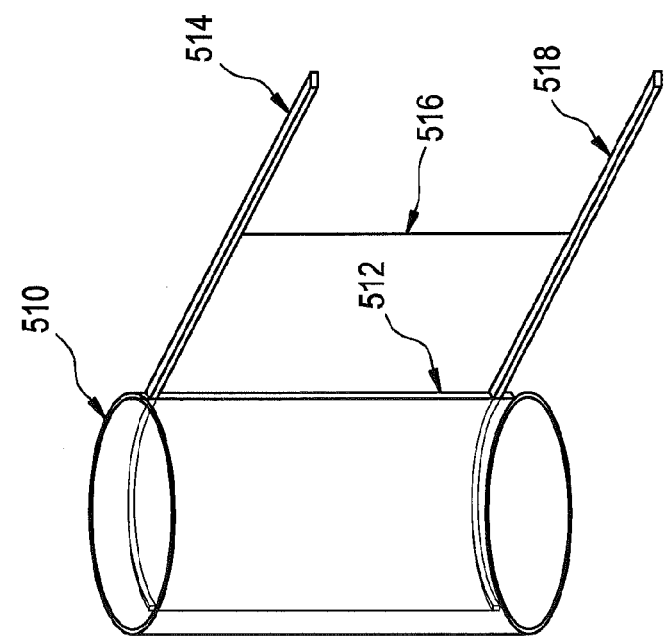

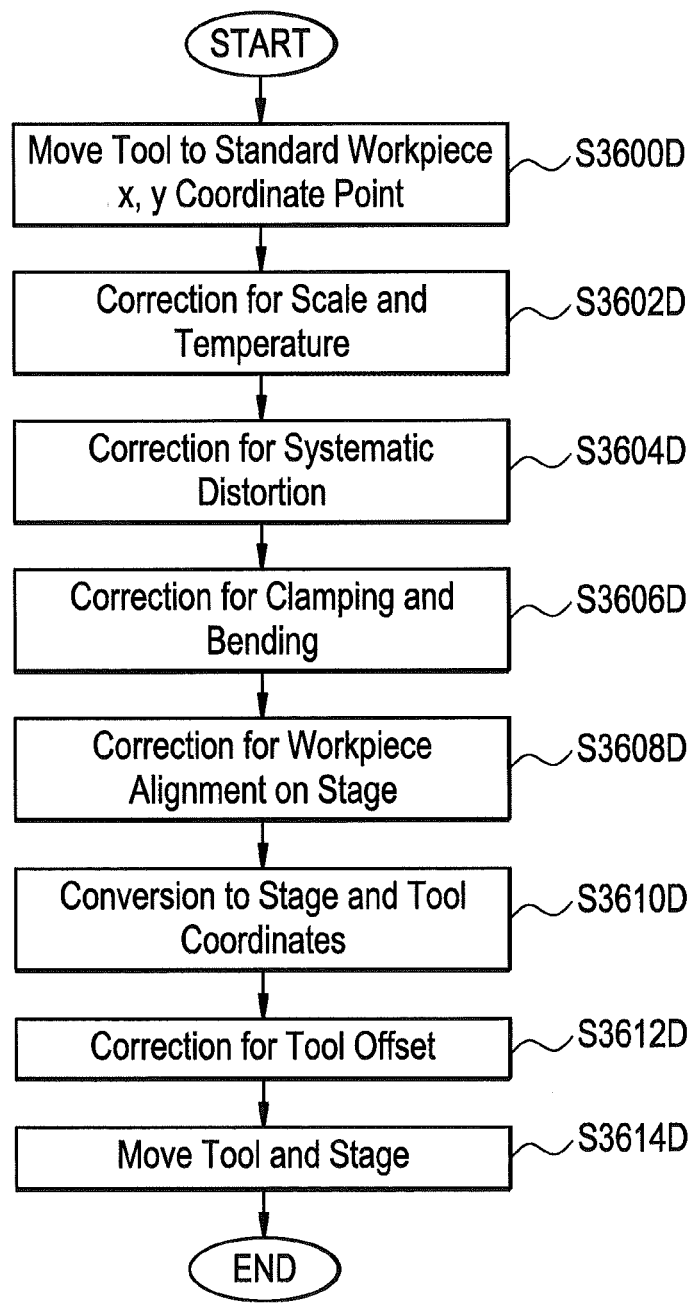

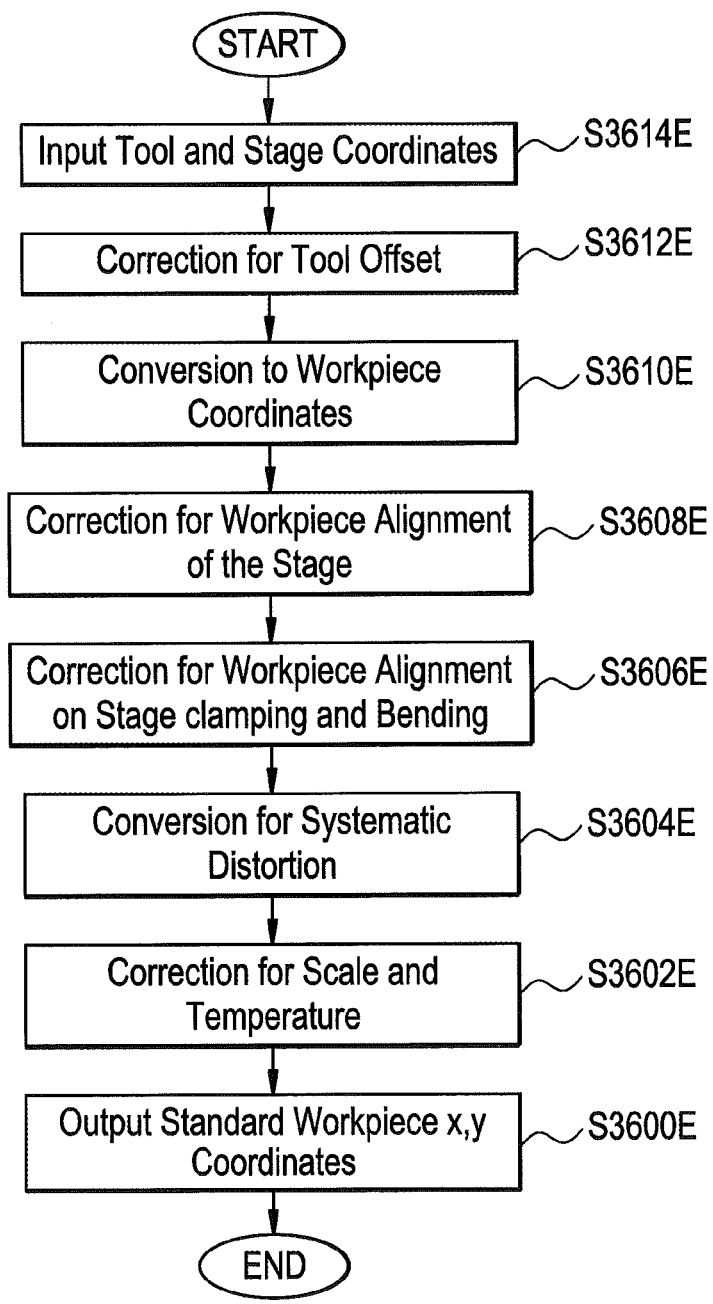

PATTERN GENERATORS, CALIBRATION SYSTEMS AND METHODS FOR PATTERNING WORKPIECES

CROSS-REFERENCE TO RELATED APPLICATION(S)

This nonprovisional U.S. patent application is a Divisional of U.S. application Ser. No. 13/064,067, filed Mar. 3, 2011, which claims priority under 35 U.S.C. 119(e) to provisional U.S. patent application No. 61/282,584, filed on Mar. 3, 2010, the entire contents of each of which are incorporated herein by reference.

The entire contents of U.S. patent application Ser. No. 12/591,954, filed on Dec. 4, 2009 and U.S. provisional patent application No. 61/193,522, filed on Dec. 5, 2008, are incorporated herein by reference.

The entire contents of U.S. patent application Ser. No. 11/711, 895, filed on Feb. 28, 2007, now U.S. Pat. No. 8,122, 846, is also incorporated herein by reference.

BACKGROUND

Pattern matching is useful in performing fast real-time alignment when patterning a workpiece. In at least some cases, however, performing sufficiently precise pattern matching and/or determining locations of pixels in a pattern to be generated on a workpiece with sufficient precision is somewhat difficult.

SUMMARY

Example embodiments describe a pattern generator comprising a calibration system configured to determine a correlation between a coordinate system of a writing tool and a coordinate system of a calibration plate at least partly based on an optical beam reflected from the calibration plate.

According to at least some example embodiments, the calibration system is configured to determine a correlation between the coordinate system of the writing tool and the coordinate system of a calibration plate on one of the workpiece and the stage (e.g., a reference board attached to the carrier stage) at least partly based on at least one optical correlation signal, or pattern, in the form of at least one optical beam reflected from at least one reflective pattern on the surface of the calibration plate.

According to at least some other example embodiments, the correlation between the coordinate system of the writing tool and the coordinate system of the calibration plate is determined at least partly prior to the generating of the pattern on the workpiece.

According to at least some example embodiments, the calibration system is configured to determine the correlation while the writing tool is generating the pattern on the workpiece and the pattern generator is configured to perform real-time alignment of the pattern at least partly based on an optical beam reflected from the calibration plate, for example, an optical correlation signal, or pattern, in the form of at least one optical beam reflected from at least one reflective pattern on the surface of the calibration plate.

BRIEF DESCRIPTION OF THE DRAWINGS

Example embodiments will be described with regard to the drawings in which:

FIG. 24 shows a workpiece processing system including a plurality of cylinder stages.

FIG. 25A shows an example cylindrical stage oriented horizontally.

FIG. 25B shows an example cylindrical stage oriented vertically.

FIGS. 27A and 27B illustrate methods for converting from abstracted standard coordinates to tool and/or stage coordinates and vice versa.

DETAILED DESCRIPTION

Figure 1:
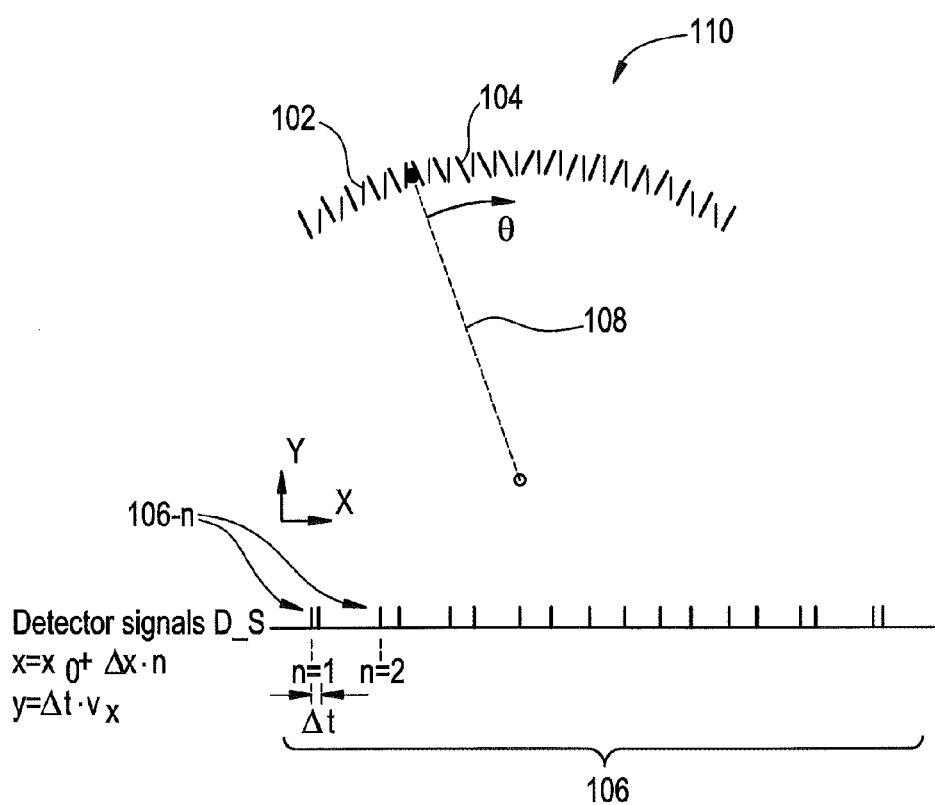
FIG. 1 illustrates a simplified example embodiment of a measurement device or tool in which a laser beam is reflected along an arm of a rotator.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only the example embodiments set forth herein.

It should be understood, however, that there is no intent to limit example embodiments to the particular ones disclosed, but on the contrary example embodiments are to cover all modifications, equivalents, and alternatives falling within the appropriate scope. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

According to example embodiments, reading and writing/patterning of a substrate or workpiece is to be understood in a broad sense. For example, reading may include microscopy, inspection, metrology, spectroscopy, interferometry, scatterometry, a combination of one or more of the aforementioned, etc. Writing/patterning may include exposing a photoresist, annealing by optical heating, ablating, creating any other change to the surface by an optical beam, etc.

Example of substrates include: flat panel displays, printed circuit boards (PCBs), substrates or workpieces in packaging applications, photovoltaic panels, etc.

Example embodiments provide methods and measurement devices for measuring a position of a laser beam, where the laser beam is reflected along an arm of a rotator towards a calibration scale at a given or desired peripheral position. As will be described in more detail below, the calibration scale (or grating) is a well-defined and spatially calibrated pattern of transparent and reflective areas, which transmit or reflect the laser beam.

According to certain example embodiments, at least one detector system is configured to detect a reflex or transmission of laser light stemming from a laser source emitting laser light that is impinging on a surface while the laser light is scanning over a scale, grating or a calibration plate.

The detector system may be used for determining the impinging position on a workpiece of a laser beam (e.g., a writing or reading beam) emitting light impinging on a workpiece.

In certain example embodiments, the detector system may comprise control means for correcting a deviation from a desired writing or reading beam position, for example, by adjusting the impinging position on a workpiece of the writing or reading beam. In a writer system, the writing beam may be used for ablating a surface or for creating a pattern on a workpiece such as a substrate or a wafer.

According to certain example embodiments, correction of the writing beam, or reading beam, position may be achieved by steering the writing beam during movement of an optical system, for example, by adjusting the impinging position of at least one writing beam on a workpiece.

According to at least one other example embodiment, correction of the writing beam position may be achieved by using an optical component such as a mirror (e.g., a deformable mirror) for steering the writing beam during the movement of the optical system.

According to yet another example embodiment, the position of a writing beam, or a reading beam, may be corrected between the scanning sweeps.

Example embodiments are related to pattern generators, measurement systems, measurement devices and measurement tools. For the sake of clarity, example embodiments are discussed with regard to a pattern generator including a rotator. The rotator may include one or more arms (e.g., 2, 3, 4, 5, 6 or even more arms), and each arm may include an optical system configured to write/pattern or read a pattern or image. In one example, the reading/writing head of an arm is stationary or essentially stationary and the optical image is translated by a rotating or swinging optical system from a position near the axis of rotation to a position further away from the axis of rotation. In one example, the rotating system may include two parallel mirrors, and may therefore scan a circle on the workpiece.

Measurement data (e.g., peripheral position data) determined according to example embodiments may be combined with other position measurement devices (e.g., linear encoders or interferometers) for the y position and with rotational encoders for the x position. The combination may provide more absolute Cartesian coordinates during full revolutions and over full linear motion of a system.

Example embodiments may be utilized in conjunction with a continuously rotating system, which exchanges relatively little or no energy and relatively small vibrations with the environment.

At least one example embodiment provides a measurement device for measuring a peripheral position in a Cartesian coordinate system. According to at least this example embodiment, the measurement device includes: a rotating laser source, a reflector, a scale and a detector. The rotating laser source is configured to emit a rotating laser beam along a radius of a rotator. The reflector is configured to reflect the laser beam in a direction orthogonal to a path of the laser beam. The scale has a pattern of transparent and reflective areas, and is positioned at a peripheral position of the measurement device. The detector is configured to provide a sequence of pulses by detecting a reflex or transmission of the rotating laser beam while the laser beam scans over the scale. The sequence of pulses corresponds to Cartesian coordinates of the system.

At least one other example embodiment provides a method for measuring a peripheral position in a Cartesian coordinate system. According to at least this example embodiment, a rotating laser beam is emitted along a radius of a rotator; the rotating laser beam is reflected in a direction orthogonal to a path of the laser beam; and a sequence of pulses is provided by detecting a reflex or transmission of the rotating laser beam while the laser beam scans over a pattern of transparent and reflective areas positioned at a peripheral area of the measurement device. The sequence of pulses corresponds to Cartesian coordinates of the system.

According to at least some example embodiments, the rotator includes a plurality of arms, and the reflector is configured to reflect the laser beam along one of the plurality of arms of the rotator. Every other pulse in the sequence of pulses represents a position in a first direction of the Cartesian coordinate system. A time difference between consecutive pulses represents a position in a second direction of the Cartesian coordinate system.

According to at least some example embodiments, the detector may be arranged on an upper portion of the scale.

According to at least some example embodiments, the measurement device may further include a bearing (e.g., an air bearing pad) configured to maintain a fixed relative distance between the scale and the table. According to at least some example embodiments, at least one air bearing is configured to maintain a fixed relative distance (or position) between the scale and the table orthogonal to the direction of movement of the table by providing the at least one air bearing between the table and a support member of the scale.

According to at least some example embodiments, the measurement device may further include a spring loaded pad and a bearing configured to guide the scale along a side of the table.

According to at least some other example embodiments, the measurement device may include at least one pad (e.g., an air bearing pad) for maintaining a relative position between the scale and the table by extending the guiding along the side of the table in the moving direction of the table (y direction) so that the scale follows the table rotation.

According to at least some other example embodiments, the measurement device may include at least two spring loaded pads configured to maintain the scale at a fixed position over the table by sliding along the side of the table at a given or defined distance.

According to at least some other example embodiments, the measurement device may include at least one spring loaded pad (e.g., air bearing pad) for maintaining a distance between the support member of the scale and the table in a direction orthogonal to the moving direction of the table and at least one second pad (e.g., air bearing pad) extending the guiding along the side of the table in the moving direction of the table (y direction) so that the scale follows the table rotation.

The laser source may be separate from a source configured to emit an exposure beam. In this case, the reflector may be configured to reflect the laser beam in a first direction toward the scale and to reflect the exposure beam in a second direction toward the workpiece. Alternatively, the reflector may be configured to reflect the laser beam and the exposure beam in the same direction. In this case, the laser beam emitted by the laser source may also serve as an exposure beam for exposing a workpiece. The reflector may reflect a first portion of the laser beam toward the workpiece for exposing the workpiece and a second portion of the laser beam toward the scale. Alternatively, the first portion of the laser beam and the second portion of the laser beam may be reflected in opposite directions.

According to at least some example embodiments, the laser beam may be reflected toward the workpiece for exposing the workpiece, and a reflected portion of the laser beam for exposing the workpiece may be reflected back toward the scale, which is arranged above the reflector.

FIG. 1 illustrates a simplified, example embodiment of a measurement device or tool in which a laser beam is reflected along an arm (or radius) of a rotator.

Referring to FIG. 1, a laser beam 108 scans over a scale or grating 110 in the clockwise (or θ) direction. A reflex and/or transmission of the laser beam 108 is detected by a detector (not shown). The detector generates a detector signal D_S composed of a sequence of pulses 106 based on the detected reflexes and/or transmissions of the laser beam 108. The detector may generate a pulse for each detected reflex and/or transmission of the laser beam 108, and the sequence of pulses corresponds to Cartesian coordinate(s).

According to at least this example embodiment, the detector may be any detector configured to generate a sequence of pulses based on detected reflexes or transmissions of light. In one example, the detector discussed above with regard to FIG. 1 may be any standard or conventional light detector that measures the intensity of light.

Still referring to FIG. 1, the scale 110 includes vertical slits 102 and slanted slits 104. In this example, every other pulse 106-$n$ of the detector signal D_S corresponds to a specific x position in the Cartesian coordinate system, and the time $\Delta t$ between two consecutive pulses corresponds to a specific y position in the Cartesian coordinate system.

Figure 2:
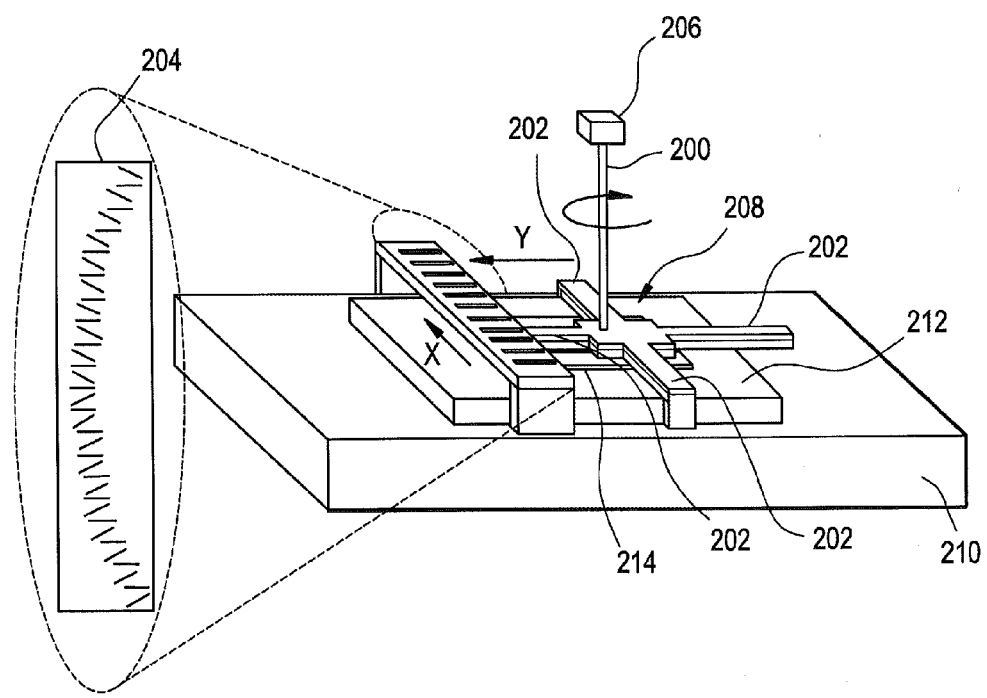
FIG. 2 shows a measurement device including a rotator according to an example embodiment.

FIG. 2 shows a measurement device or system including a rotator according to an example embodiment.

Referring to FIG. 2, the measurement device includes a rotator 208 having four arms 202. The rotator 208 is arranged above a base 210. A table 212 is arranged on the base 210 and capable of holding a workpiece 214.

In example operation, a laser source 206 emits a rotating or scanning laser beam 200 toward the rotator 208. The laser beam 200 is reflected (e.g., by a reflector, which is not shown) along an arm 202 of the rotator 208 toward a scale 204 arranged at the periphery of the table 212.

Still referring to FIG. 2, another reflector (also not shown in FIG. 2) reflects the laser beam 200 upward towards the scale 204. As the laser beam 200 scans across the scale 204, the scale 204 reflects the laser beam 200 back toward a detector located at a non-rotating position. In at least this example embodiment, the detector may be located near the laser source in a non-rotating location, and the returning light may be reflected horizontally (e.g., 90 degrees from the vertical beam in FIG. 2) by a 45 degree semi-transparent plate (not shown).

As the laser beam 200 scans the scale 204 in FIG. 2, the detector generates a detector signal including a sequence of pulses. As discussed above with regard to FIG. 1, for example, every other pulse of the detector signal corresponds to a specific x position in the Cartesian coordinate system, and the time $\Delta t$ between two consecutive pulses corresponds to a specific y position in the Cartesian coordinate system. Thus, Cartesian coordinates of a given or desired peripheral position may be determined based on the generated detector signal.

As was the case with FIG. 1, the detector discussed above with regard to FIG. 2 may be any standard or conventional light detector that measures the intensity of light.

According to at least some example embodiments, the scale 204 and/or the table 212 may be configured to move in the x and/or y directions such that the scale 204 is positionable relative to the table 212.

Figure 3:
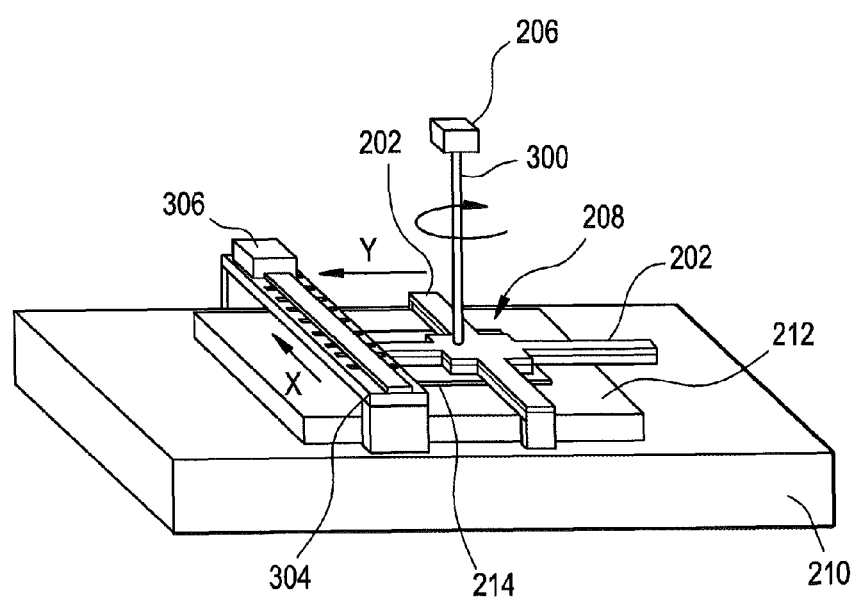
FIG. 3 shows a measurement device according to another example embodiment.

FIG. 3 shows a measurement device according to another example embodiment. The measurement device shown in FIG. 3 is similar to the measurement device shown in FIG. 2, except that the transmission of light is measured on the backside of the scale. In FIGS. 2 and 3, like numerals refer to like elements.

Referring to FIG. 3, the measurement device includes the rotator 208 having four arms 202. The rotator 208 is arranged above the base 210. The laser source 206 emits a rotating laser beam 300 toward the rotator 208. The rotating laser beam 300 is reflected along one of the arms 202 by a reflector (not shown). The laser beam 300 is then reflected up towards the scale 304 at the periphery of the table 212 by another reflector (also not shown). As the laser beam 300 scans across the scale 304, the laser beam 300 is transmitted through the scale 304 and detected by a detector 306 arranged on or relatively close to an upper surface (e.g., backside) of the scale 304.

In this example embodiment, the detector 306 generates a detector signal including a sequence of pulses. As discussed above with regard to FIGS. 1 and 2, for example, every other pulse of the detector signal corresponds to a specific x position in the Cartesian coordinate system, and the time $\Delta t$ between two consecutive pulses corresponds to a specific y position in the Cartesian coordinate system. Thus, Cartesian coordinates of a given or desired peripheral position may be determined based on the generated detector signal.

As was the case with FIGS. 1 and 2, the detector 306 discussed above with regard to FIG. 3 may be any standard or conventional light detector that measures the intensity of light.

In a system with a combination of rotational and prismatic movement (where the prismatic movement is, e.g., a moving table), the relative position in the direction orthogonal to the movement may be measured by guiding the scale 204, 304 along the side of the table 212 with a bearing. To handle rotation of the table 212, two or more guiding pads may be added such that the scale 204, 304 follows the rotation of the table 212.

According to example embodiments, the spring loaded guiding pads may be implemented in a number of ways. For example, the spring loaded guiding pads may be air bearings, sleeve bearings, magnetic bearings, etc. The pads are capable of sliding along the side of the table at a given or defined distance in the orthogonal direction, and thereby maintain the scale at a fixed position over the table.

Figure 4:
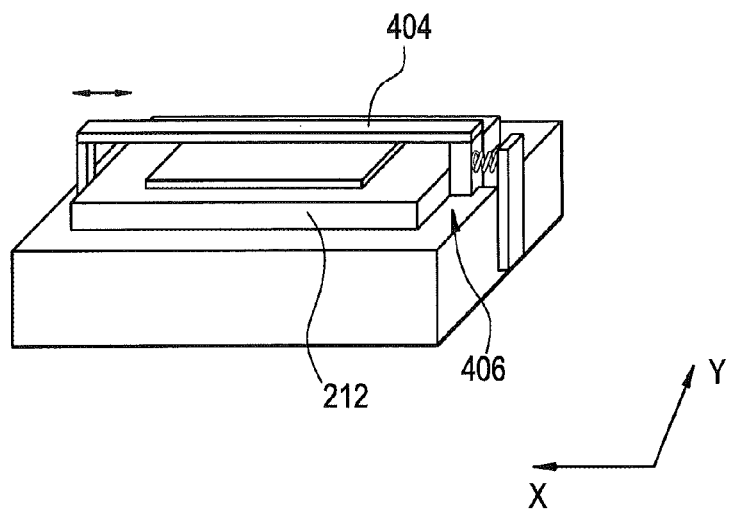
FIG. 4 illustrates a scale arrangement according to an example embodiment.

FIG. 4 illustrates a portion of a measurement device according to an example embodiment. In this example embodiment, the scale 404 is attached to a spring loaded pad 406 guided with a bearing along the side of the table 212.

Figure 5:
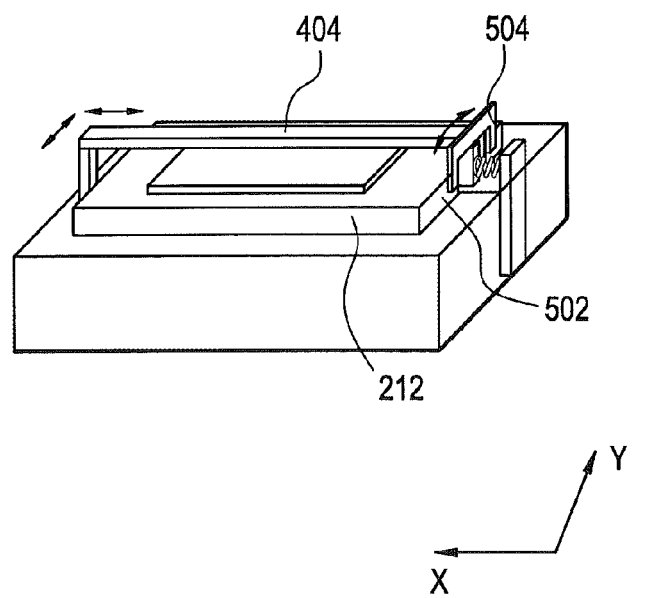
FIG. 5 shows a scale arrangement according to another example embodiment.

FIG. 5 shows a portion of a measurement device configured similar to the portion of the system shown in FIG. 4, but with two more pads 502 and 504 added to adjust the scale rotation according to the table rotation. In FIG. 5, the two extra pads 502 and 504 extend the guiding along the side of the table 212 in the y direction so that the scale 404 follows the table rotation.

FIGS. 6 through 9 illustrate portions of measurement devices configured to reflect a measuring beam toward/on a scale according to different example embodiments. As shown and described in more detail below, the measuring beam may be derived from an exposure beam or from a completely separate laser source.

Figure 6:
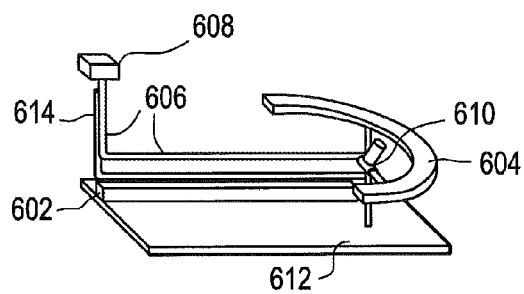
FIG. 6 shows a portion of a measurement device including an overhead scale according to an example embodiment.

FIG. 6 shows a portion of a measurement device including an overhead scale according to an example embodiment. In this example embodiment, the measuring laser beam 606 is derived from a laser source 608, which is separate from the source of an exposure beam 614.

Referring to FIG. 6, in example operation, a laser source 608 emits a rotating laser beam 606 toward an arm 602 of a rotator. The laser beam 606 is directed along the arm 602 toward a reflector 610. The reflector 610 reflects the laser beam 606 toward the scale 604, which is arranged above the table 612. The laser beam 606 scans across the scale 604, and transmissions or reflexes of the laser beam 606 are detected by a detector (not shown).

In this example, the detector may generate a detector signal based on the detected transmissions or reflexes of the scanning laser beam 606, and the Cartesian coordinates of a given or desired peripheral position may be determined based on the sequence of pulses comprising the detector signal. The detector discussed above with regard to FIG. 6 may be any standard or conventional light detector that measures the intensity of light.

According to at least the example embodiment shown in FIG. 6, the reflector 610 is arranged between the table 612 and the scale 604.

Figure 7:
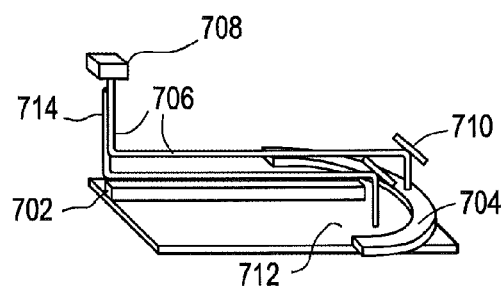
FIG. 7 shows a portion of a measurement device according to another example embodiment.

FIG. 7 shows a portion of a measurement device including a scale according to an example embodiment. In this example, the scale is arranged closer to the surface of a stage as compared to the example embodiment shown in FIG. 6. The measuring laser beam 706 in FIG. 7 is derived from a laser source 708, which is separate from the source of an exposure beam 714.

Referring to FIG. 7, the laser source 708 emits the rotating laser beam 706 toward an arm 702 of a rotator. A reflector (not shown) directs the laser beam 706 along the arm 702 toward another reflector 710. The reflector 710 reflects the laser beam 706 downward toward the scale 704, which is arranged above the table 712. As the laser beam 706 scans across the scale 704, transmissions or reflexes of the laser beam 706 are detected by a detector (not shown) as described above.

As discussed above with regard to FIG. 6, the detector may generate a detector signal based on the detected transmissions or reflexes of the scanning laser beam 706, and the Cartesian coordinates of a given or desired peripheral position may be determined based on the sequence of pulses comprising the detector signal. The detector discussed above with regard to FIG. 7 may be any standard or conventional light detector that measures the intensity of light.

In this example embodiment, the scale 704 is arranged between the reflector 710 and the table 712.

According to at least some example embodiments, light used to expose a workpiece may be used to scan the scale.

Figure 8:
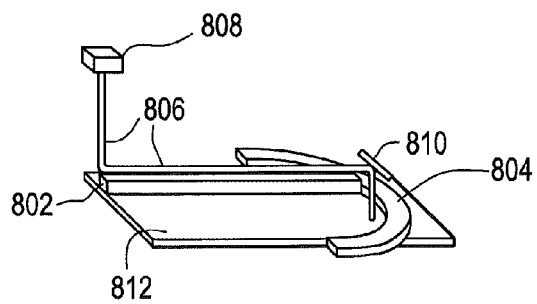
FIG. 8 shows a portion of a measurement device according to yet another example embodiment.

FIG. 8 shows an example embodiment in which a portion of an exposure beam for exposing a workpiece is used to scan a scale and determine Cartesian coordinates of a peripheral position. In this example embodiment, the measuring laser beam 806 is derived from the exposure beam.

Referring to FIG. 8, in example operation, a laser 808 emits the rotating laser beam 806 toward an arm 802 of a rotator. A reflector (not shown) reflects the laser beam 806 along the arm 802 toward another reflector 810. The reflector 810 reflects a portion of the laser beam 806 toward the table 812 and another portion of the laser beam 806 downward toward the scale 804, which is arranged above the table 812. As the laser beam 806 scans across the scale 804, reflexes of the laser beam 806 from an upper surface of the scale 804 are detected by a detector (not shown) as described above.

As discussed above, the detector may generate a detector signal based on the detected transmissions or reflexes of the scanning laser beam 806, and the Cartesian coordinates of a given or desired peripheral position may be determined based on the sequence of pulses comprising the detector signal. The detector discussed above with regard to FIG. 8 may be any standard or conventional light detector that measures the intensity of light.

Figure 9:
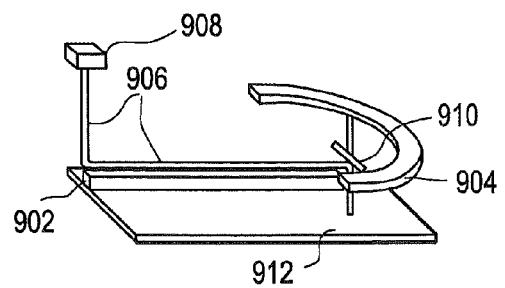
FIG. 9 shows an example embodiment in which reflection from the bottom surface of a scale is used.

FIG. 9 shows an example in which reflection/transmission from the bottom surface of a scale is used to determine Cartesian coordinates of a peripheral position. In this example embodiment, the measuring laser beam 906 is derived from an exposure beam.

Referring to FIG. 9, a laser 908 emits the rotating laser beam 906 toward an arm 902 of a rotator. A reflector (not shown) directs the laser beam 906 along the arm 902 of the rotator toward a reflector/deflector/optical element 910. The reflector/deflector 910 directs the laser beam 906 upward toward the scale 904. As the laser beam 906 scans across the scale 904, the laser beam 906 is reflected back toward the optical element 910 by the scale 904. The reflected laser beam 906 passes back through the optical element 910 and impinges the table 912 and/or is detected by a detector (not shown). As discussed above, the detector may generate a detector signal based on the detected transmissions or reflexes of the scanning laser beam 906 and the Cartesian coordinates of a given or desired peripheral position may be determined based on the sequence of pulses comprising the detector signal. The detector discussed above with regard to FIG. 9 may be any standard or conventional light detector that measures the intensity of light.

Example embodiments also provide pattern generators in which a relation or correlation between the coordinate system(s) of a calibration plate and/or board and the writer system is utilized during patterning. This relation or correlation may be provided by a calibration system before patterning and may be utilized for relatively fast real-time alignment during patterning of the workpiece.

Example embodiments are discussed in some instances with regard to a rotating system. However, example embodiments are not limited thereto. Rather, example embodiments are applicable to different stage concepts and printing technologies such as cylinder stages, helix concepts for roll-to-roll printing, etc. Furthermore, example embodiments are not be limited to using a diffracted portion of a writing beam impinging on a pattern on a calibration plate and/or board. Rather, in alternative embodiments, a separate beam or SLM aerial image impinging on the pattern of the calibration plate and/or board may also be used for relatively fast real-time alignment during patterning.

According to at least some example embodiments, the calibration system is configured to determine a correlation between a coordinate system of the writing tool and a coordinate system of a calibration plate at least partly based on an optical beam reflected from the calibration plate.

According to at least some example embodiments, the calibration system is configured to determine a correlation between the coordinate system of the writing tool and the coordinate system of a calibration plate on one of the workpiece and the stage (e.g., a reference board attached to the carrier stage) at least partly based on at least one optical correlation signal, or pattern, in the form of at least one optical beam reflected from at least one reflective pattern on the surface of the calibration plate.

According to at least some example embodiments, the calibration plate is a reference board having a fixed relation to the carrier stage on which the workpiece is placed. In one example, the reference board may be attached to the carrier stage.

According to at least some example embodiments, the calibration system is configured to determine a correlation between the coordinate system of the writing tool and the coordinate system of a calibration plate on one of the stage and the workpiece, at least partly based on a one-dimensional pattern, or image, reflected from the calibration plate.

According to at least some other example embodiments, the calibration system is configured to determine a correlation between the coordinate system of the writing tool and the coordinate system of a calibration plate on one of the stage and the workpiece, at least partly based on a two-dimensional image, or pattern, reflected from the calibration plate.

According to at least some example embodiments, the calibration system is configured to determine a correlation between the coordinate system of the writing tool and the coordinate system of a calibration plate on one of the stage and the workpiece, while generating the pattern on the workpiece. The calibration system may be configured to determine the correlation between the coordinate system of the writing tool and the coordinate system of the calibration plate while simultaneously, or concurrently, generating the pattern on the workpiece.

According to at least some example embodiments, the pattern generator is configured to perform real-time alignment of the pattern based on the determined correlation between the coordinate system of the writing tool and the coordinate system of the calibration plate.

According to at least some example embodiments, the calibration system is configured to determine the correlation while the writing tool is generating the pattern on the workpiece and the pattern generator is configured to perform real-time alignment of the pattern at least partly based on an optical beam reflected from the calibration plate, for example, an optical correlation signal, or pattern, in the form of at least one optical beam reflected from at least one reflective pattern on the surface of the calibration plate.

According to at least some example embodiments, the correlation between the coordinate system of the writing tool and the coordinate system of the calibration plate is determined at least partly during the generating of the pattern on the workpiece.

According to at least some other example embodiments, the correlation between the coordinate system of the writing tool and the coordinate system of the calibration plate is determined at least partly in between the writing strokes of at least one writing unit of the writing tool generating the pattern on the workpiece. In example embodiments, the correlation is determined at least partly in between the writing sweeps of one rotor arm of the writer tool and/or in between the writing sweeps of at least two separate rotor arms of the writer tool.

According to at least some other example embodiments, the correlation between the coordinate system of the writing tool and the coordinate system of the calibration plate is determined at least partly prior to the generating of the pattern on the workpiece.

According to at least some example embodiments, the calibration system comprises or is coupled to a measurement system including means for emitting at least one optical beam toward the calibration plate and recognition software designed to recognize an optical correlation signal, or pattern, in the form of the emitted at least one optical beam being reflected from at least one reflective pattern on the surface of the calibration plate.

According to at least some example embodiments, a tailored SLM pattern that interacts with a pattern is introduced to provide a relatively precise position of the SLM of the writer system. The relatively precise position of the SLM is obtained through a correlation measurement and subsequently measured (Cartesian) coordinates of the calibration plate and/or board.

Figure 10:
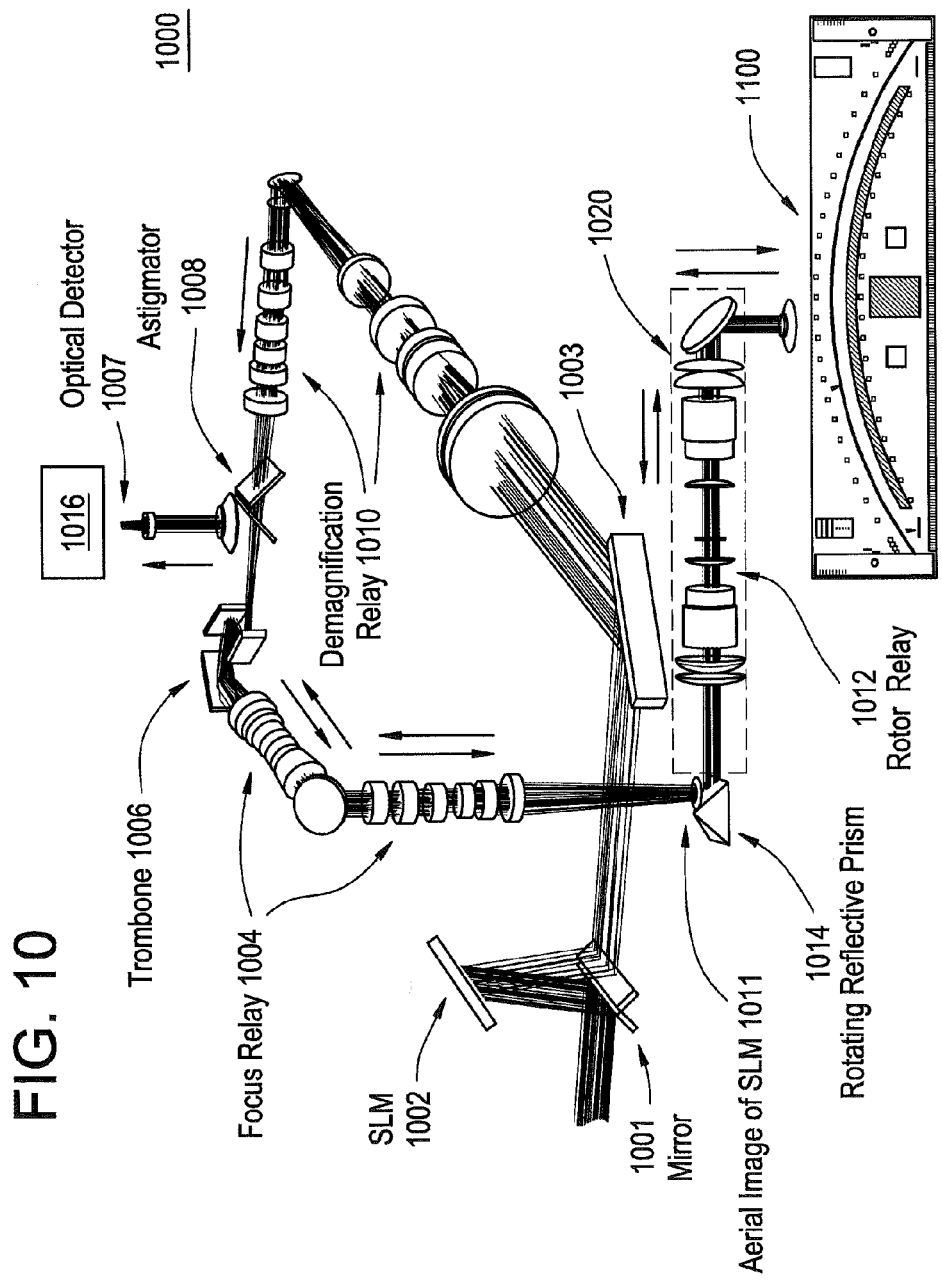
FIG. 10 illustrates an optical path of an example laser direct imaging (LDI) writer and measurement system according to an example embodiment.

FIG. 10 illustrates an optical path of a laser direct imaging (LDI) writer and measurement system 1000 according to an example embodiment. In this example embodiment, an optical beam reflected from a calibration plate 1100 is collected and sampled by an optical detector 1007. A calibration system 1016 may then provide information regarding pattern orientation, translation and/or scaling based on the collected and sampled optical beam.

The optical beam used for calibration (hereinafter the "optical correlation beam") is transmitted along a path similar or substantially similar to the path of the optical beam used for writing (hereinafter the "writing optical beam"), except that the calibration optical beam is sampled by the optical detector 1007 as discussed in more detail later.

Referring to FIG. 10, a mirror 1001 reflects the writing optical beam (e.g., a laser beam or beams) emitted from an optical beam source (e.g., a laser source, which is not shown) toward a spatial light modulator (SLM) 1002. The SLM 1002 reflects the writing optical beam with a spatially modulated image (SLM image) back toward the mirror 1001. The mirror 1001 directs the writing optical beam toward an angled mirror 1003. The angled mirror 1003 directs the writing optical beam toward demagnification relay optics 1010, which demagnify the writing optical beam A semi-transparent astigmator 1008 shapes the demagnified writing optical beam to a line focus of the LDI writer 1000. The semi-transparent astigmator 1008 passes the shaped optical writing beam to a trombone 1006.

The trombone 1006 includes at least two mechanically translatable right-angled mirrors and is configured to change the optical path and hence also the final focus of the writing optical beam.

Referring still to FIG. 10, the trombone 1006 directs the shaped writing optical beam toward a focus relay 1004. The writing optical signal passes through the focus relay 1004 to an aerial image 1011 of the SLM, this image positioned just above a reflective pyramid-shaped rotating prism 1014.

The reflective pyramid-shaped rotating prism 1014 is mechanically locked to one or more rotor arms. For the sake of clarity, only one rotor arm 1020 is shown in FIG. 10. The rotor arm 1020 includes rotor relay optics 1012.

The rotor relay optics 1012 focus and direct the writing optical beam toward the calibration plate 1100. The calibration plate 1100 may be part of (e.g., integral) or fixed to a stage (not shown) or part of a workpiece on the stage. As discussed in more detail below, the calibration plate 1100 includes a plurality of reflective patterns of areas configured to reflect the writing optical beam for calibrating the spatial position, focus and/or dose of the writing optical beam. The areas may have different (e.g., relatively high and relatively low) reflectance.

Referring back to FIG. 10, the calibration plate 1100 reflects the writing optical beam back toward the rotor arm 1020 as the optical correlation beam, resulting from the correlation between the pattern of the impinging optical beam and the reflective pattern on the calibration plate. The optical correlation beam propagates backwards through the LDI writer 1000 via a path similar or substantially similar (but reverse) to the optical path of the writing optical beam until reaching the semi-transparent astigmator 1008.

The semi-transparent astigmator 1008 directs/reflects the optical correlation beam toward an optical detector 1007 and calibration system 1016.

The optical detector 1007 generates an analog electrical signal based on the optical correlation beam. The electrical signal is sampled, analog-to-digitally converted and further analyzed by the calibration system 1016 using algorithms specific to the calibration of the LDI writer 1000. The calibration system 1016 may be implemented by one or more central processing units (CPUs), digital signal processors (DSPs), application-specific-integrated-circuits (ASICs), field programmable gate arrays (FPGAs), computers or the like.

In more detail, according to at least some example embodiments, the calibration system 1016 is configured to measure a step response of samples reflected for each rotor arm 1020 and provide a focus map as function of rotor angle x(a).

The calibration system 1016 may also be configured to measure optical intensity in the plane of the calibration plate 1100 and to calibrate the dose controller (not shown) for each rotor arm 1020 and for a set of positions along an exposure sweep.

According to at least some example embodiments, the calibration system 1016 is configured to measure an orientation of the calibration plate 1100, x-offsets and y-offsets of the calibration plate 1100, x-scales and y-scales of the calibration plate 1100, and a shape and position of the SLM image on the calibration plate 1100 as a function of the rotor angle x(a) (e.g., for each rotor arm). Based on these measurements, the calibration system 1016 may provide a correlation between the coordinate systems of the calibration plate 1100 and the LDI writer 1000.

In the case of a rotary system, the calibration system 1016 may also be configured to measure rotor arm radius, rotor rotation center, and one single sweep per rotor arm. Based on these measurements, the calibration system 1016 may provide a relatively fast check of the validity of the calibration before printing.

In addition, the calibration system 1016 may be configured to measure the registration of a known pattern over a dedicated glass plate and provide an extended y-scale as well as compensation for snaking of the stage in orientation or x-direction as the stage moves.

Figure 11:
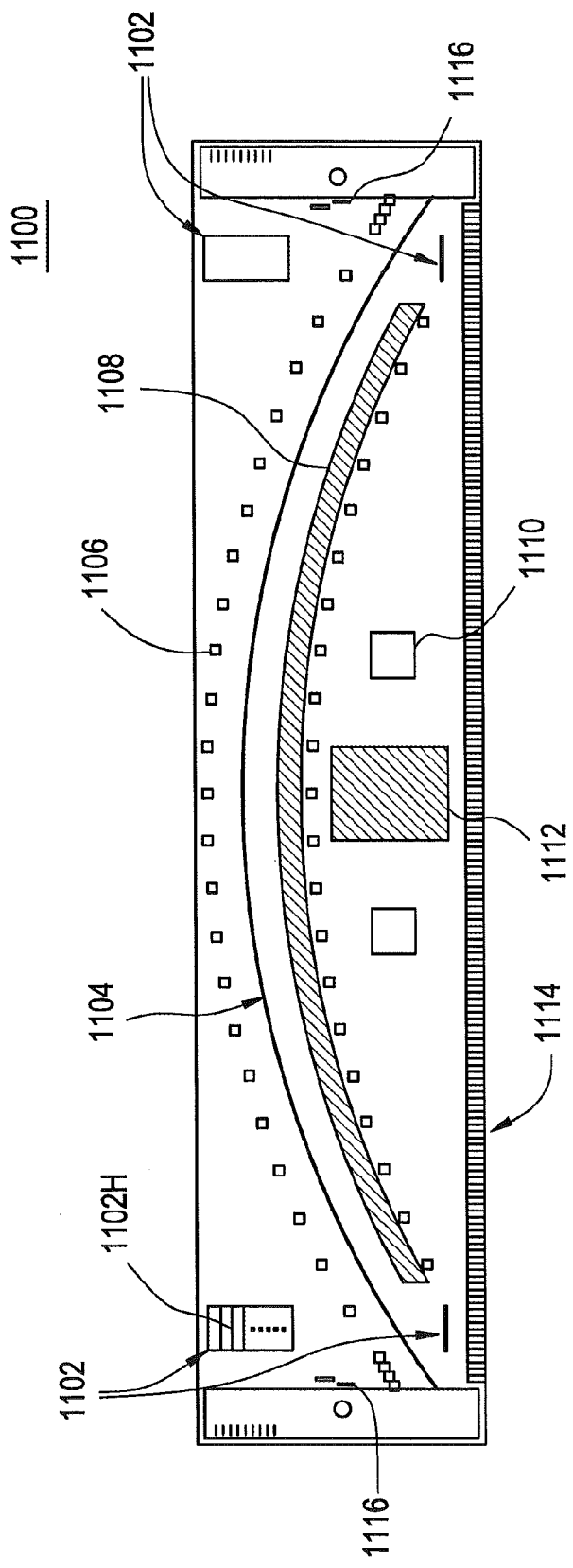
FIG. 11 shows a layout of a calibration plate of a measurement system according to an example embodiment.

FIG. 11 shows an example embodiment of the calibration plate 1100 in more detail.

The calibration plate 1100 shown in FIG. 11 is configured to reflect the optical writing beam for calibrating: spatial position, focus and/or dose of the optical writing beam. According to example embodiments, the calibration plate 1100 may have areas of different (e.g., relatively high and relatively low) reflectance. In one example, the calibration plate 1100 may be a chrome or similarly reflective plate.

Referring in more detail to FIG. 11, the calibration plate 1100 includes a plurality of horizontal barcode patterns 1102. Each of the horizontal barcode patterns 1102 includes a plurality of horizontal bars 1102H arranged in a barcode pattern. The plurality of horizontal barcode patterns 1102 are configured to produce optical correlation signals for measuring y-scale and y-offset of the position of the writing optical beam.

The calibration plate 1100 further includes a track 1104. The track 1104 includes a plurality of sets of vertical bars (x-bars) and a plurality of slanted barcode patterns. As discussed in more detail below with regard to FIG. 17, the plurality of slanted barcode patterns are interwoven and/or interlaced between the sets of vertical bars and the slanted barcode patterns are configured to extract actual x and y-positions of a projected SLM line image in a single sweep over the calibration plate 1100.

Still referring to FIG. 11, the calibration plate 1100 further includes a plurality of pads 1106 for topographic measurement of focus over the extent of the calibration plate 1100. The calibration plate 1100 also includes a relatively sparse raster of other vertical bars 1108 for relatively coarse calibration of focus.

A plurality of verification pads 1110 are provided to verify modulator delay compensation and/or timing of, for example, an LDI writer in which the calibration plate 1100 may be implemented.

A plurality of fans of lines 1112 are provided for calibrating the angular orientation of the calibration plate 1100. The plurality of fan lines 1112 will be described in more detail later with regard to FIG. 13.

An area of dots 1114 are configured for calibrating alignment cameras (not shown) to the coordinate system of the calibration plate 1100.

Still referring to FIG. 11, the calibration plate 1100 further includes a plurality of alignment pads 1116. The plurality of alignment pads 1116 are configured for assisting with mechanical alignment of the calibration plate 1100 during mounting on the stage (not shown).

Figure 17:
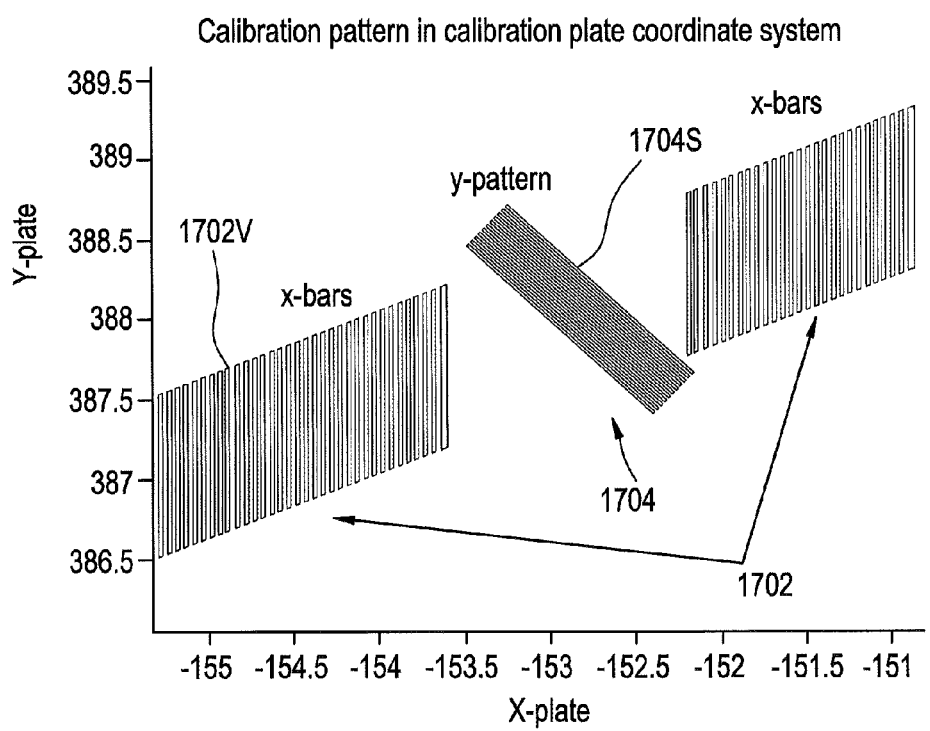
FIG. 17 is a more detailed illustration of a portion of the example embodiment of the track shown in FIG. 11.

FIG. 17 is a more detailed illustration of a portion of the track 1104 shown in FIG. 11.

As discussed above with regard to FIG. 11, the track 1104 includes a plurality of sets of vertical bars (x-bars) and a plurality of slanted barcode patterns interlaced (or interwoven) between the plurality of sets of vertical bars. Although discussed with regard to a plurality of slanted barcode patterns, the track 1104 may include one or more slanted barcode patterns. Moreover, according to at least some example embodiments, the slanted barcode patterns are oriented obliquely relative to the vertical and horizontal bars described herein.

Each of the slanted barcode patterns includes a plurality of slanted bars arranged in a barcode pattern, such as a Barker-code pattern, a Barker-code like pattern or a similar pattern.

Referring to FIG. 17, the slanted barcode pattern 1704 (also referred to as a y-pattern barcode) is positioned between sets of vertical bars 1702. Each set of vertical bars 1702 includes a plurality of vertical bars 1702V. The slanted barcode pattern 1704 includes a plurality of slanted bars 1704S.

The pattern of interweaving the slanted barcode patterns 1704 between the sets of vertical bars 1702 may be repeated (e.g., periodically) throughout the track 1104.

In example operation, by passing a SLM line image along the path of the track 1104, the transition between different (e.g., low and high) reflectance of the vertical bars 1702V provides an optical correlation signal indicative of the x-scale and the x-offset of the calibration plate 1100. This is described in more detail below with regard to FIGS. 14A and 14B.

In the example shown in FIG. 17, the x-coordinates of each vertical bar 1702V are known from the design of the calibration plate 1100. Thus, the x-coordinates of the slanted barcode pattern 1704 are obtained by interpolating over the gap between the sets of vertical bars 1702.

In one example, the position of the correlation peak relative to its closest neighboring vertical bar 1702V provides the y-position of the writing optical beam. This provides the x and y coordinates of where the SLM line image crosses the slanted barcode pattern 1704.

Measuring a full arc of the trajectory pattern provides a complete or substantially complete position of the SLM in a total of, for example, 152 points. Eight different regions along the SLM are measured, and rotor radius R, rotor rotation center ($x_0$ and $y_0$), SLM average x-position as a function of rotor angle x(a), and SLM shape and position deviation from an ideal circle defined by the extracted radius and rotation center $d_x$n and $d_y$n are extracted. The SLM average x-position as a function of rotor angle x(a) is used to calibrate an x-order table.

Figure 16A:
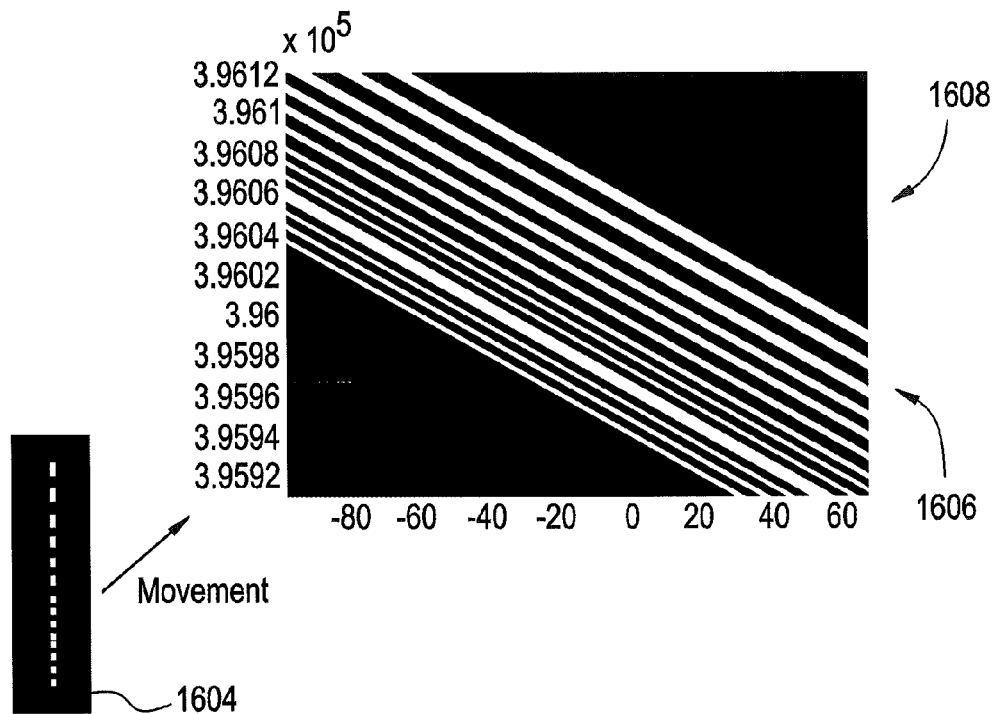
FIG. 16A shows a more detailed illustration of a reflective slanted barcode pattern on a substrate of otherwise relatively low reflectance.

FIG. 16A shows a more detailed illustration of a slanted barcode pattern of relatively high reflective bars on an otherwise relatively low reflective substrate.

Figure 16B:
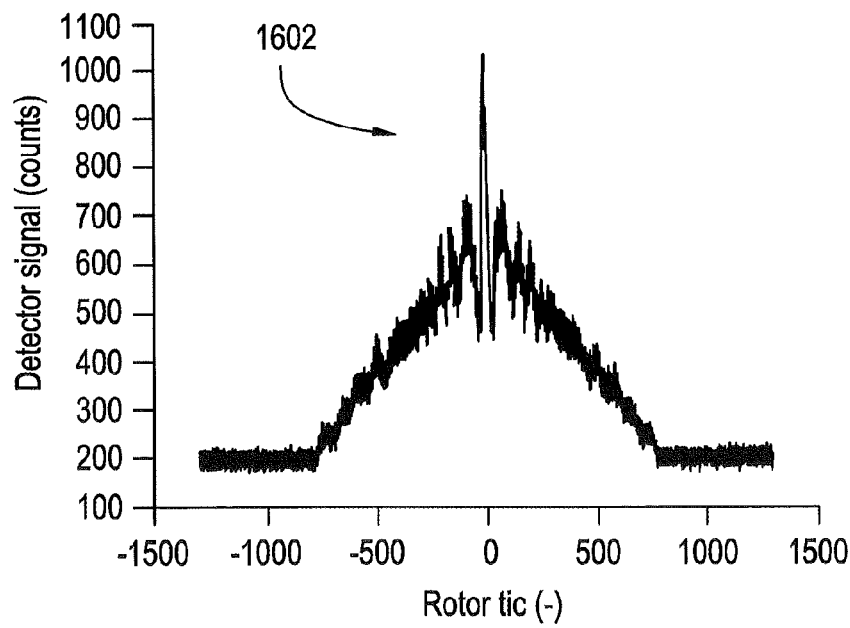
FIG. 16B is a graph illustrating an example optical correlation signal indicative of the correlation between the SLM line image and the reflective pattern as a function of the angular position of the rotor arm.

FIG. 16B is a graph illustrating an example correlation signal indicative of the correlation between the SLM line image and the reflective pattern depending on the position of the rotor arm.

Referring to FIG. 16A, in this example embodiment, the slanted bars in the slanted barcode pattern 1606 are arranged in a Barker-code pattern. A SLM line pattern 1604 matching the Barker-code pattern is imaged to the plane of the calibration plate 1100 as shown in FIG. 16A. As the SLM line image 1604 traverses a path (e.g., an arc path) intersecting the slanted barcode pattern 1606, the reflected optical beam is indicative of the correlation between the SLM line image 1604 and the slanted barcode pattern 1606.

As shown in FIG. 16B, the single peak 1602 of the optical correlation signal corresponds to the position where the SLM line image 1604 matches the slanted barcode pattern 1606. A position for the y-coordinate at which the SLM line image matches the slanted barcode pattern 1606 is obtained by comparing the position of the correlation peak with the positions of the nearest neighboring vertical bar.

Figure 12A:
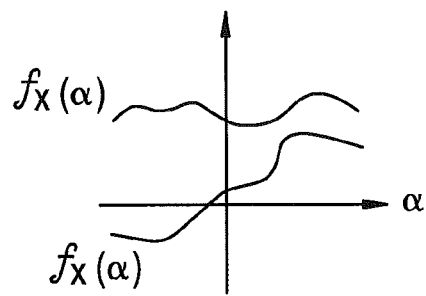
FIG. 12A schematically shows an extraction of correction (or deviation) functions $f_x(a)$ and $f_y(a)$ in respective Cartesian directions x and y, as a function of the rotor angle a, to compensate for errors or imperfections in the optical projection of a spatial light modulator (SLM) image to the substrate that is to be exposed by the LDI writer.

FIG. 12A schematically shows example correction (or deviation) functions $f_x(a)$ and $f_y(a)$. The correction functions $f_x(a)$ and $f_y(a)$ are used to compensate for errors or imperfections in the optical projection of the SLM line image to the substrate that is to be exposed by, for example, an LDI writer (e.g., LDI writer 1000 shown in FIG. 10).

Figure 12B:
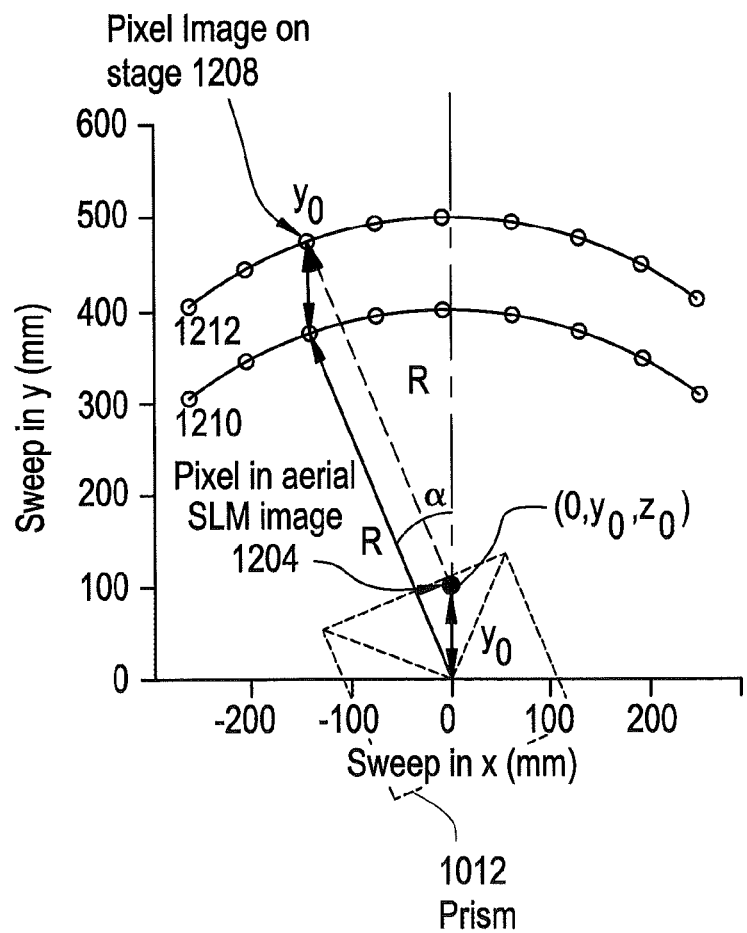
FIG. 12B shows an example global coordinate system illustrating example dependency between the errors or imperfections and the actual position $y_0$ of a pixel on the SLM.

FIG. 12B shows an example global coordinate system illustrating example dependency between the errors or imperfections and the actual position $y_0$ of the pixel on the SLM.

Referring to FIGS. 12A and 12B, after sampling x and y coordinates of vertical bars and slanted barcode patterns as a function of the rotor angle a along the track 1104 shown in FIG. 11, the obtained set of coordinates (x(a), y(a)) are compared to an ideal (or perfect) circular (or elliptical) arc obtained using a least-square regression to the obtained points. The deviations in the coordinates (x(a), y(a)) from the ideal circular arc are subsequently extracted as the deviation functions $f_x(a)$ in the x-direction and $f_y(a)$ in the y-direction. When mapping an SLM pattern to be written on a substrate, the extracted deviation functions $f_x(a)$ and $f_y(a)$ may be tabulated and compensated for in spatial position.

The deviations described by the deviation functions $f_x(a)$ and $f_y(a)$ also depend on the actual position $y_0$ of the pixel on the SLM as shown in FIG. 12B.

As shown in FIG. 12B, a pixel 1204 in the aerial image 1011 of the SLM above the reflective pyramid-shaped prism 1012 shown in FIG. 10, for example, is reflected through the rotor arm 1020 and toward an image 1208 of the SLM pixel on the stage plane (e.g., calibration plate or substrate). Depending on the actual position $y_0$ of the pixel on the SLM, the path traversed by the pixel will be described by the function (x(a, $y_0$), y(a,$y_0$)) with the associated deviation functions $f_x(a,y_0)$ and $f_y(a,y_0)$ mapping the deviation of the trajectory as function of rotor angle a and position in the SLM 1002.

Still referring to FIGS. 12A and 12B, because the SLM virtual image position (0,$y_0$) just above the reflective pyramid-shaped prism 1012 in the global coordinate system is known, the fundamental movement is described by Equation (1) shown below.

$$\dot{x}=R\sin(\alpha)+f_x(y_0,\alpha)$$

$$\dot{y}=-y_0+R\cos(\alpha)+S_y+f_y(y_0,\alpha) \qquad (1)$$

In Equation (1), the deviation functions $f_x(a,y_0)$ and $f_y(a,y_0)$ describe the unpredictable portion of the SLM image trajectory, which needs to be calibrated. As the pyramid-shaped prism 1012 and the connected rotor arm 1020 rotates, the trajectory described by Equation (1) provides the motion of an arbitrary pixel at position $y_0$ of the one-dimensional array of pixels in the SLM. The nominal path for a perfectly aligned and substantially error-free system may be described by Equation (1) with deviation functions $f_x(a,y_0)$ and $f_y(a,y_0)$ being zero or substantially zero. However, due to projection errors and optical aberrations, the path described by the pixels in any real system no longer follows the ideal circular arc. Rather, the path described by the pixels follows a path on which the additional deviations described by $f_x(a,y_0)$ and $f_y(a,y_0)$ are superimposed in the x and y directions, respectively. The goal of the calibration is to determine these deviations together with the effective radius R and offset $S_y$ in Equation (1).

After determining these parameters, for example, by measuring the traversed trajectories on a relatively well-defined and traceable calibration pattern, the parameters may be applied to compensate for projection errors and optical aberrations. The determined parameters enable effective error compensation, thereby improving writing performance.

Figure 13:
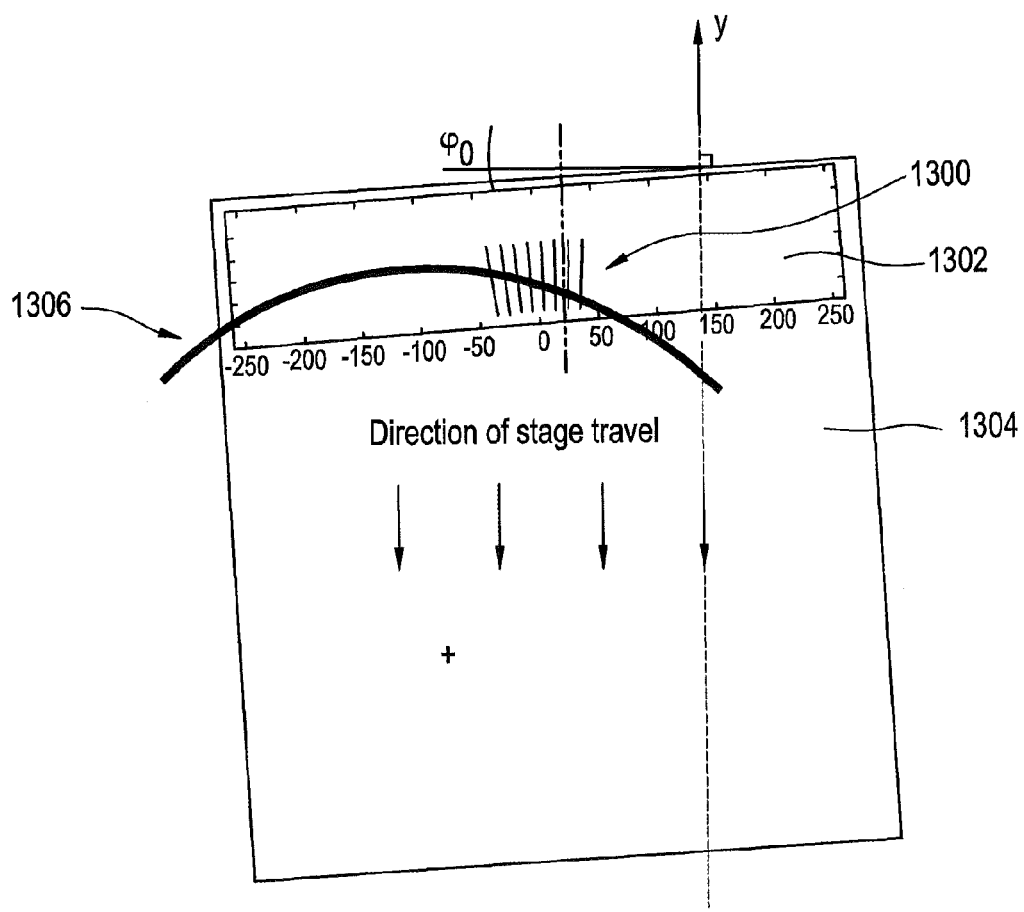
FIG. 13 shows an example embodiment in which a calibration plate is mounted on a stage and where a fan of lines of features are scanned with intermediate translations of the stage, in order to determine the angular orientation of the calibration plate.

FIG. 13 shows an example embodiment in which a calibration plate is mounted on a stage.

Referring to FIG. 13, the calibration plate 1302 includes a fan of reflective bars 1300. In this example, the stage 1304 is traveling linearly along the y-axis. The fan pattern 1300 shown in FIG. 13 corresponds to the fan pattern 1112 described above with regard to FIG. 11.

As the path described by the SLM line image intersects the fan pattern 1300, a set of correlation peaks in the resulting correlation signal are recorded as function of the rotor angle a. The correlation peaks are similar to those discussed above with regard to FIG. 16B.

As the correlation peaks are repeatedly recorded for different positions of the stage 1304, the recorded correlation peaks diverge or converge toward a common line 1306 on the calibration plate 1302. The position of this common line 1306 relative to the fan pattern 1300 provides the necessary information regarding the angular orientation $\phi_0$ of the calibration plate 1302 relative to the y-axis. The angular orientation $\phi_0$ is used to extract, for example, the x-scale of the calibration plate 1302.

According to at least some example embodiments, the calibration system 1016 described above with regard to FIG. 10 may provide scaling factors for subsequently measured Cartesian coordinates of a calibration plate relative to the writer (axis-of-motion) system.

Figure 14A:
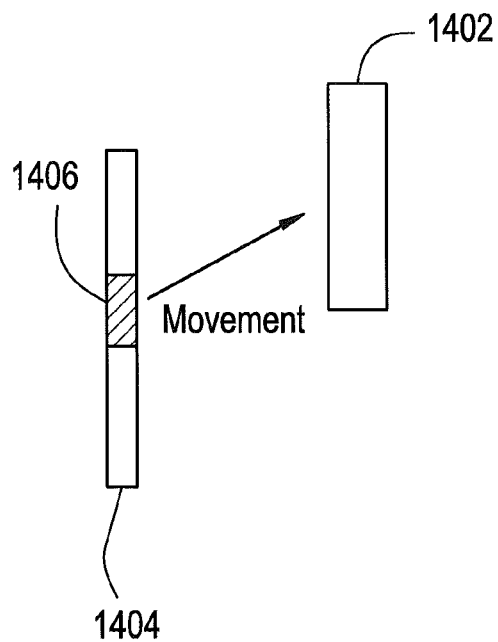
FIG. 14A shows an example in which a homogeneously illuminated and lit-up block of pixels in the SLM line image traverses a path over a reflective vertical bar, this bar being oriented along the main axis of the SLM line image.
Figure 14B:
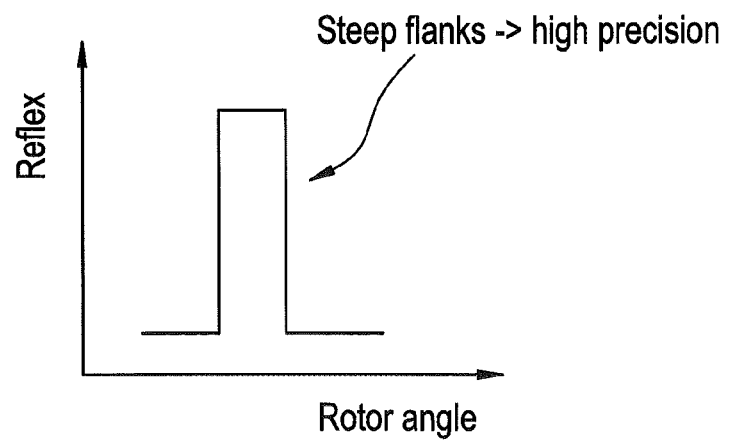
FIG. 14B is a graph illustrating an example correlation signal resulting from the path traversed in FIG. 14A, with a sharp transition between low and high reflectance.

FIG. 14A shows an example in which a homogeneously illuminated block of pixels in the SLM line image traverses a path over a reflective vertical bar 1402. FIG. 14B is a graph illustrating an example correlation signal resulting from the path traversed in FIG. 14A.

In more detail, FIG. 14A shows an illuminated block of pixels 1406 in an SLM line image 1404 traversing a path over a reflective vertical bar 1402. The reflective vertical bar 1402 is oriented along the y-axis.

As the SLM line image 1404 enters or exits the reflective area of the vertical bar 1402, a steep transition between relatively low and relatively high reflectance provides a relatively sharp transition in the optical correlation signal shown in FIG. 14B. The relatively sharp transition in the optical correlation signal shown in FIG. 14B provides a relatively high definition of the position of the vertical bar 1402 along the x-axis.

Figure 15A:
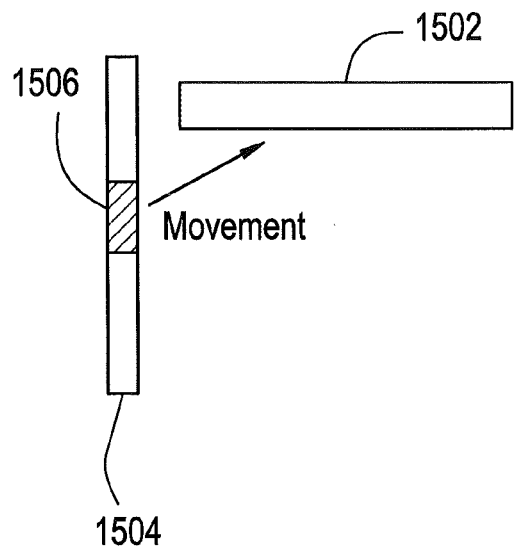
FIG. 15A shows an example in which a homogeneously illuminated block of pixels in the SLM line image traverses a path over a reflective horizontal bar, this bar being oriented orthogonally to the line image of the SLM.
Figure 15B:
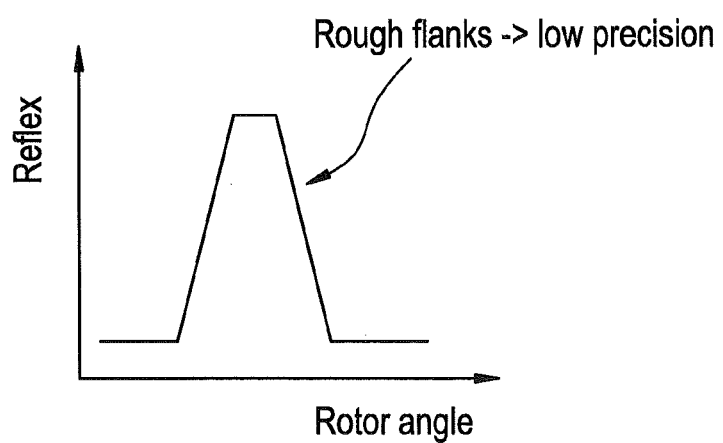
FIG. 15B is a graph illustrating an example correlation signal resulting from the path traversed in FIG. 15A, with a flatter transition between low and high reflectance as compared to FIG. 14B.

FIG. 15A shows an example in which a homogeneously illuminated block of pixels in the SLM line image traverses a path over a reflective horizontal bar 1502. FIG. 15B is a graph illustrating an example correlation signal resulting from the path traversed in FIG. 15A.

In more detail, FIG. 15A shows a homogeneously illuminated block of pixels 1506 in an SLM line image 1504 traversing a path over a reflective horizontal bar 1502. The reflective horizontal bar 1502 is oriented horizontally along the x-axis.

As shown in FIG. 15B, the transition between relatively low and relatively high reflectance is no longer relatively sharp as the SLM line image 1504 enters or exits the reflective area of the horizontal bar 1502. Rather, the correlation signal shown in FIG. 15B has sloped edges leading to the maximum amplitude of the correlation signal.

In the case of a finite-contrast SLM, with some background light present in the un-illuminated areas surrounding the illuminated section, the background level in the resulting signal may be considerable. Thus, illumination of a relatively large section of the SLM may be required. However, this may result in an even lower slope in the transition (less sharp transition) in the optical correlation signal. The decrease in sharpness results in relatively low precision when determining the y-position of the reflective bar. By using barcode patterns (e.g., Barker or Barker-like coding schemes), this problem may be avoided.

Figure 18A:
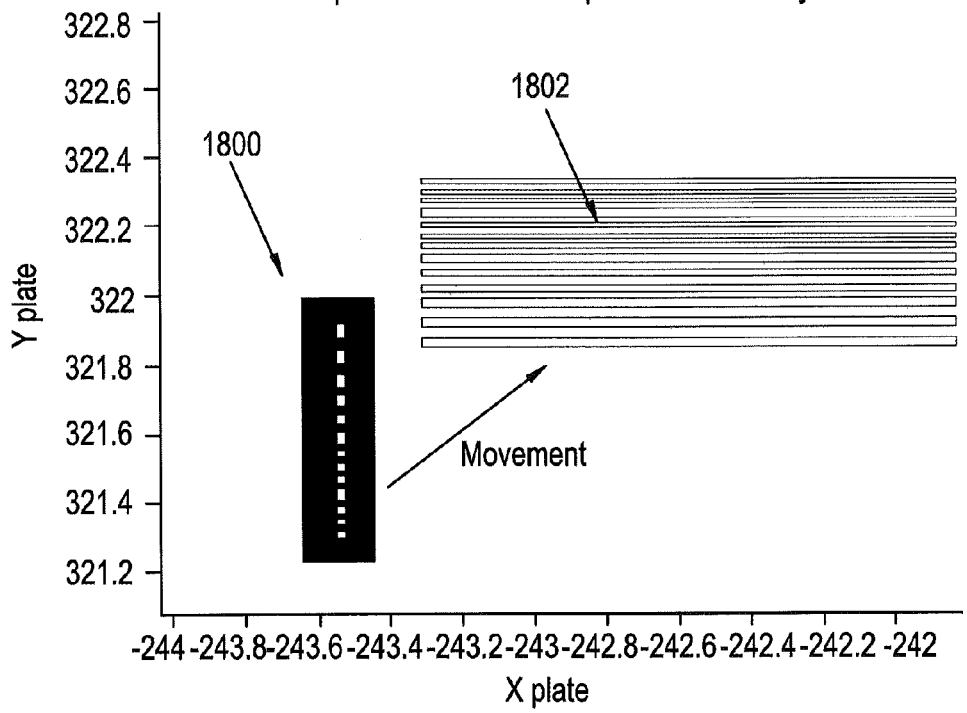
FIGS. 18A and 18B illustrate example graphs for explaining y-scale calibration according to an example embodiment.
Figure 18B:
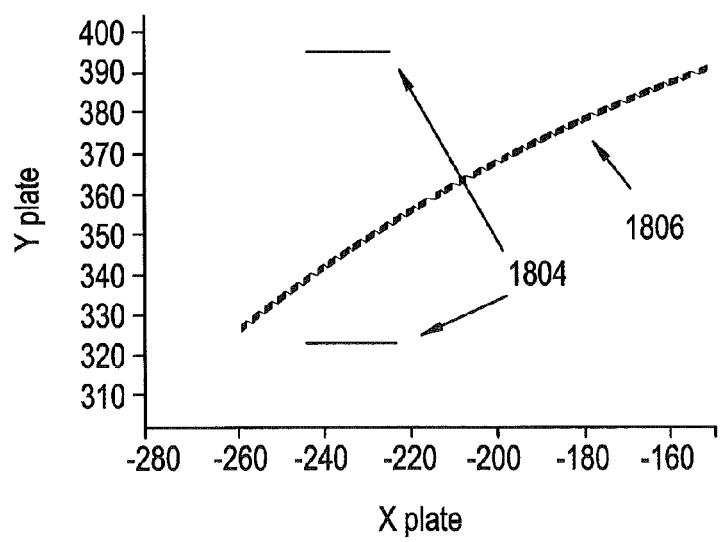

FIGS. 18A and 18B illustrate example graphs for explaining y-scale calibration according to an example embodiment.

In more detail, FIG. 18A illustrates an example for addressing relatively low precision in determining the y-position for a finite-contrast SLM image.

As shown in FIG. 18A, rather than illuminating a homogeneous block of pixels of the SLM as in FIG. 15A, a pattern of illuminated pixels 1800 in the SLM line image are illuminated. And, rather than a single horizontal bar as shown in FIG. 15A, a horizontal barcode pattern 1802 is used. The horizontal barcode pattern 1802 in FIG. 18A corresponds to the horizontal barcode patterns 1102 described above with regard to FIG. 11.

In FIG. 18A, when the pattern of illuminated pixels 1800 is swept over a horizontal barcode pattern 1802 having a pattern matching the pattern of illuminated pixels 1800, the optical correlation signal for a properly chosen pattern yields a single correlation peak. Unlike the example discussed with regard to FIGS. 15A and 15B, the single correlation peak is relatively well discriminated from the background.

This single and well-defined correlation peak provides improved resolution and signal-to-noise ratio relative to the homogeneous block of illuminated pixels 1502 shown in FIG. 15A.

FIG. 18B illustrates an example including horizontal barcode patterns 1804 and a track 1806 including slanted barcode patterns interweaved between sets of vertical bars as discussed above with regard to FIG. 17.

The horizontal barcode patterns 1804 in FIG. 18B provide scaling and offset along the y-axis.

In the case of the slanted barcode patterns, a calibration system (e.g., 1016 in FIG. 10) processes the sampled optical correlation beam for x and y positions, thereby yielding information regarding the scale and offset for both orthogonal axes in a single scan. This may reduce calibration time while maintaining relatively high accuracy.

Figure 19:
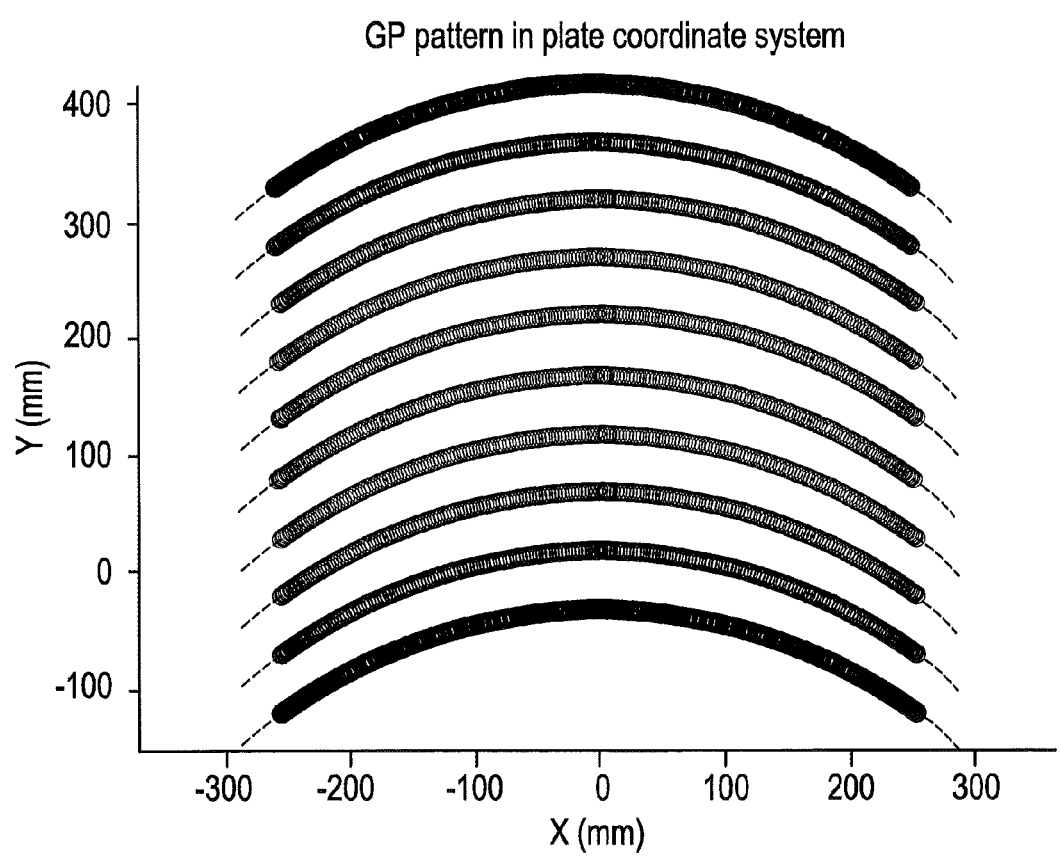
FIG. 19 is a graph for illustrating how repeated use of single-scan measurements of trajectories may be performed on a calibration plate configured as described above with regard to FIGS. 11 and 17 to provide information regarding distortion and deviation over a larger area.

FIG. 19 is a graph for illustrating how repeated use of single-scan measurements of trajectories may be performed on a calibration plate configured as described above with regard to, for example, FIGS. 11 and 17 to provide information regarding distortion and deviation over a larger area.

In mask writing, such a calibration plate is commonly referred to as a "golden plate" (GP) and is used to calibrate and/or compensate for deviations that depend on stage movements.

At least some example embodiments provide pattern generators utilizing a calibration plate or board fixed to a stage. The stage is configured to hold a workpiece to be printed and/or measured.

At least one example embodiment provides a pattern generator including: a writing tool and a calibration system. The writing tool is configured to generate a pattern on a workpiece arranged on a stage. The writing tool may be an LDI writer, a helix scanner, a rotary scanner, a linear scanner, etc.

The calibration system is configured to determine a correlation between a coordinate system of the writing tool and a coordinate system of a calibration plate on one of the stage and the workpiece. While generating the pattern on the workpiece, the pattern generator is also configured to perform real-time alignment of the pattern based on the determined correlation between the coordinate system of writing tool and the coordinate system of the calibration plate.

As mentioned above, although example embodiments are discussed in some instances with regard to a rotor or rotating system, example embodiments are not limited thereto. Rather, example embodiments are applicable to different stage concepts and printing technologies such as cylindrical stages, helix concepts for roll-to-roll printing, etc., examples of which are discussed below with regard to FIGS. 20A-35.

Furthermore, example embodiments should not be limited to using a diffracted or reflected portion of an optical writing beam impinging on a pattern of a calibration plate and/or board. Rather, in alternative embodiments, a separate beam or SLM aerial image impinging on the pattern of a calibration plate and/or board may be used for fast real-time alignment during patterning.

Figure 21:
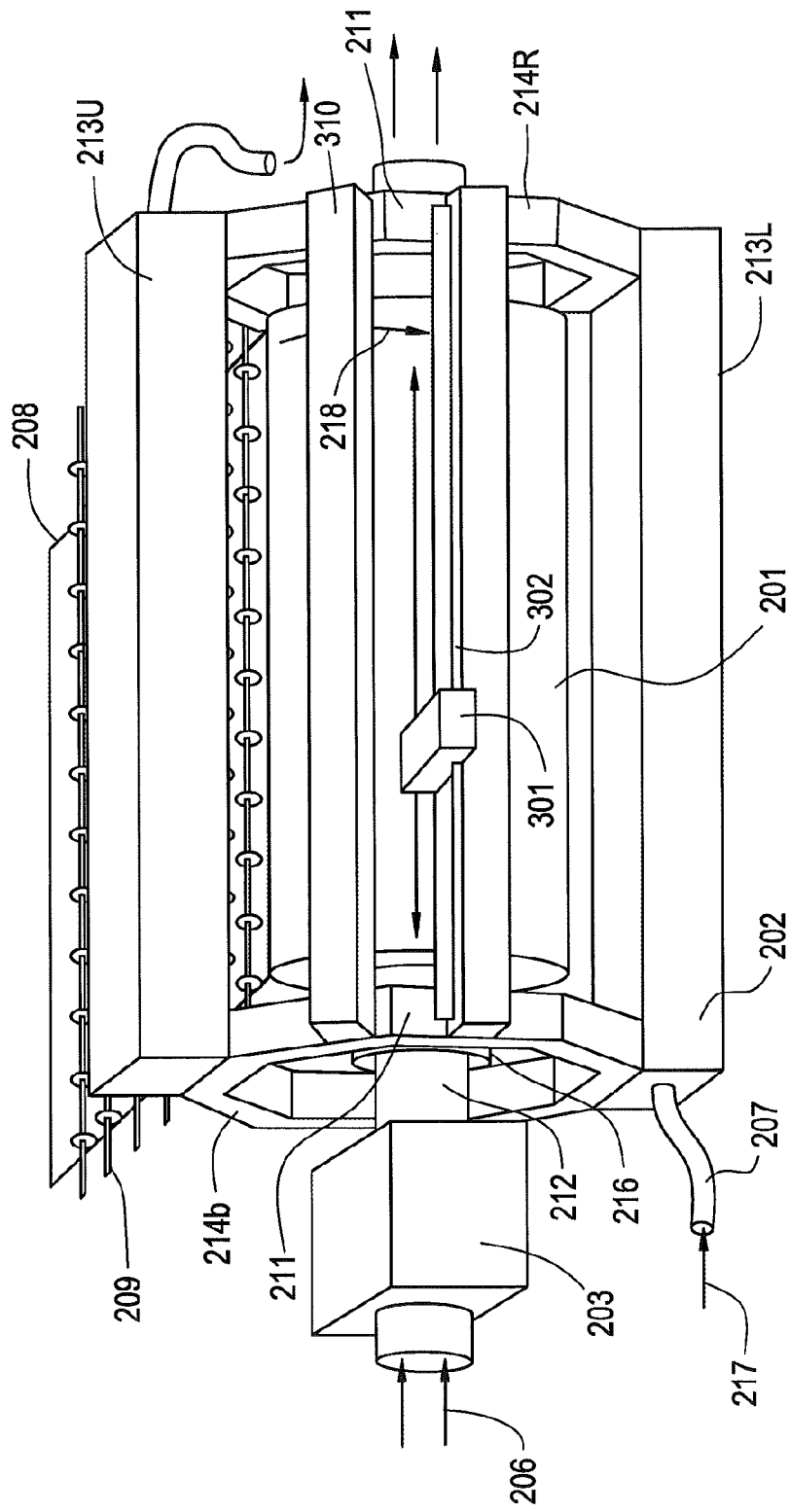
FIG. 21 illustrates a portion of a pattern generator having a cylinder stage.

FIG. 21 illustrates a printing platform including a cylindrical stage. Methods, apparatuses and/or devices described above with regard to the LDI writer shown in FIG. 10 may also be implemented in conjunction with the printing platform shown in FIG. 21. Because the concepts and/or principles of example embodiments are substantially the same as those discussed above, a detailed discussion is omitted for the sake of brevity.

Referring to FIG. 21, the platform includes a frame 202 having upper and lower supporting structures 213U and 213L and end support structures 214L and 214R. The support structures 213U, 213L, 214L and 214R may be formed, for example, of a continuous piece of metallic material (e.g., sheet metal). As shown in FIG. 21, the support structures 213U, 213L, 214L and 214R include a tube 207 formed therein for temperature control. The temperature of the support structures 213U, 213L, 214L and 214R may be controlled by flowing fluid (e.g., air, liquid, gas, etc.) through the tube 207 in direction 217.

Alternatively, the support structures 213U, 213L, 214L and 214R may be formed in a piecemeal fashion, in which each of the support structures 213U, 213L, 214L and 214R are formed individually, and subsequently assembled.

A cylinder or cylindrical stage 201 is arranged within the frame 202. In one example, the cylinder 201 may have a diameter of about 1 meter and the length of about 2 meters.

The cylinder 201 is mounted on a rotating axis 212 using bearings 216. A driving device such as a motor 203 is attached to one end of the rotating axis 212 to drive the rotating axis 212 causing the cylinder 201 to rotate in a direction 218. The cylinder 201 may be, for example, about 500 kg and the bearings 216 may be, for example, hydrostatic fluid bearings; however, any suitable bearings may be used. The fluid may be, for example, air, liquid, gas, etc. Hydrostatic fluid bearings are well-known in the art, and therefore, a detailed discussion will be omitted for the sake of brevity.

In at least one example, a cylinder that is about 1 meter in diameter and about 2.5 meters long may be supported, for example, by hydrostatic bearings. The rotating axis 212 may be an extension of the rotor or may be fixed.

Referring still to FIG. 21, the temperature of the frame 202 and the cylinder 201 may be controlled by forced cooling. The forced cooling may be performed by flowing fluid (e.g., liquid, air, gas, etc.) through the rotating axis 212 in a direction 206. The temperature of the frame 202 and the cylinder 201 may be controlled to a temperature between about 0° and about 0.01° Celsius, inclusive. For example, the cylinder 201 may be temperature controlled to about 0.05° Celsius or to about 0.01° Celsius.

The processing platform shown in FIG. 21 further includes a conveyor 208 for transporting workpieces to the cylinder 201. Loading and unloading of workpieces to and from the cylinder 201 will be discussed in more detail with respect to FIGS. 25A and 25B.

Referring still to FIG. 21, each end support structure 214L and 214R includes a plurality of mounting surfaces 211 upon which a plurality of toolbars 302 and 310 are arranged, mounted or fixed. Although each of the plurality of toolbars 302 and 310 may have a tool mounted thereon, FIG. 21 shows only a single tool 301 mounted on the toolbar 302 for the sake of clarity.

In example operation, the driving device 203 rotates the stage 201 to any angle and the tool 301 slides along the toolbar 302, such that the tool 301 is able to access any point on the surface of a workpiece loaded on the cylinder 201.

The tool 301 may be, for example, a metrology device and/or writing tool for establishing a more accurate coordinate system on the workpiece and/or for performing fast pattern alignment during patterning. The coordinate system may be calculated with corrections for the bending of the glass, for example, to provide the true coordinates when the workpiece (e.g. glass sheet) is later in a flat state.

In one example, the metrology device 301 may include optics (not shown) for reading fiducials on the surface of the glass and/or features of a previously formed and/or patterned layer on the workpiece. The optics of the metrology device 301 may be fixed or slide along the toolbar 302 to access any point on the workpiece. The data from the metrology device 301 may be used for a variety of operations and/or functions. For example, the data from the metrology device 301 may be used for taking measurements used in assessing distortion created by high-temperature processing and/or coating/etching. The tool 301 may also be used for aligning analytical, inspection, patterning and/or processing tools relative to a formed pattern, creating a distortion map on-the-fly for more accurate overlay between the current operation (e.g., patterning) and the previous pattern, performing fast pattern alignment during patterning of a workpiece, and/or monitoring distortion and/or drift in the coordinate system or support structure.

The platform shown in FIG. 21 has a plurality (e.g., four) of additional free positions for toolbars and may hold a plurality of (e.g., five) separate instruments, each one scanning the entire width of the stage. Platforms according to example embodiments of the present invention may include any number of toolbars and multiple tools may be mounted on each toolbar.

Figure 22:
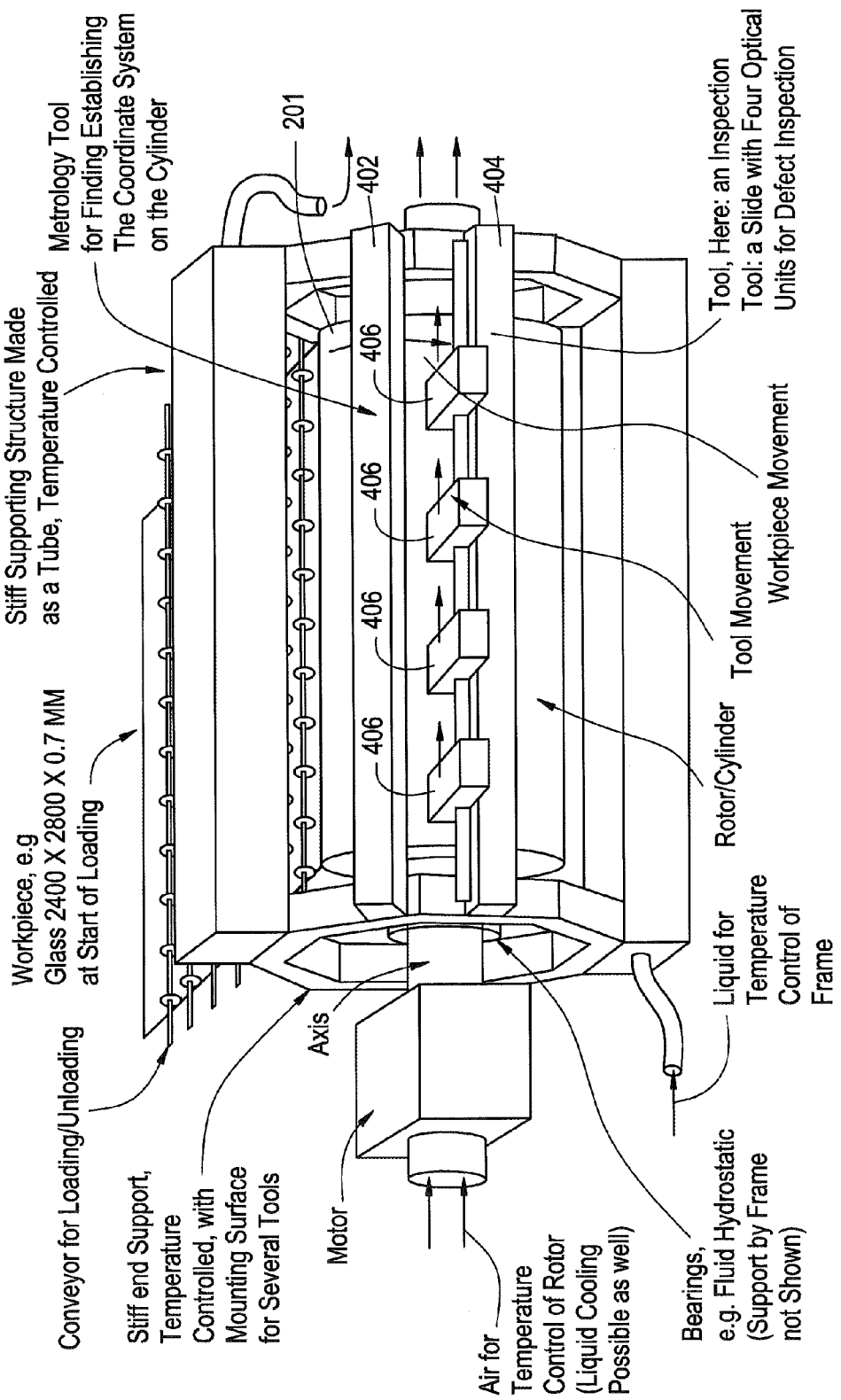
FIG. 22 illustrates a portion of another pattern generator having a cylinder stage.

FIG. 22 shows another example platform. The platform of FIG. 22 is similar to the platform shown in FIG. 21, except that the platform of FIG. 22 includes a metrology toolbar 402 and an inspection toolbar 404. The inspection toolbar 404 includes a plurality (e.g., four) of optical inspection heads 406. The optical inspection heads 406 may be the same as, or different from, one another.

Referring to FIG. 22, as shown by the arrows the cylinder 201 rotates and optical heads 404 slide along toolbar 404 to cover the entire width of a workpiece loaded on the cylinder 201. Each optical head 406 reads a stripe of the workpiece with a camera and compares the read stripe to a known reference pattern. The reference pattern may be a time-delayed portion of the same stripe, a pattern from another tool on the same or another toolbar or a reference pattern obtained from a database. Comparing the read stripe to a time-delayed portion of the same stripe or a pattern from another tool is referred to as die-to-die inspections, whereas comparing the read stripe to a reference pattern obtained from a database is referred to as die-to-database inspection.

The optical inspection heads 406 shown in FIG. 22 may be, for example, cameras, such as time-delay and integration (TDI) cameras.

Figure 23B:
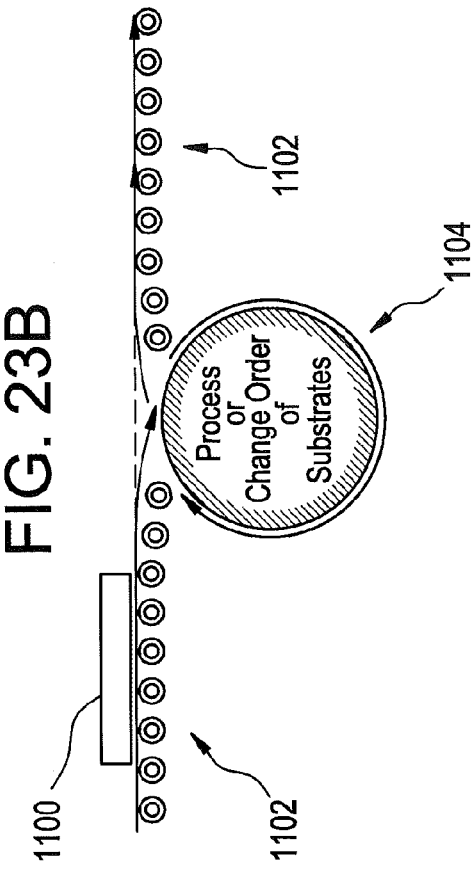
FIGS. 23A-23C shows example roll-to-roll printing systems including one or more cylinder stages.
Figure 23A:
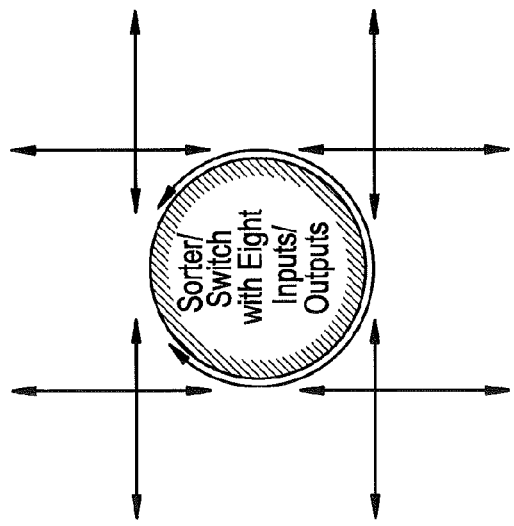

FIG. 23A illustrates a cylinder arrangement having a plurality of inputs and outputs. FIG. 23B shows an example of how the cylinder may be arranged within a processing track such that the workplaces may be captured or allowed to pass.

As shown in FIG. 23B, the workpiece 1100 carried on processing track 1102 passes over the cylinder 1104 or are taken by the cylinder 1104 depending on the desired order of the workpiece 1100 among a plurality of workpieces, which are not shown for the sake of clarity. For example, if workpiece 1100 need be delayed, then the workpiece 1100 is taken off the processing track 1102 by the cylinder 1104. While on the cylinder 1104, other workpieces may pass-over the cylindrical stage 1104 and be processed ahead of workpiece 1100. On the other hand, if no delay is required, the workpiece 1100 passes over the cylinder 1104 and continues on the processing track 1102. This arrangement may be used for an analytical instrument such as those used for sampling quality control.

The cylinder 1104 may also be used to capture, hold, and subsequently release the workpiece after a period of time to change the order of workpieces on the track. As is well-known in the art, changing the order of two elements in a sequence enables arbitrary sorting, and the ability to capture and/or hold a workpiece allows sorting of the workpieces.

Figure 23C:
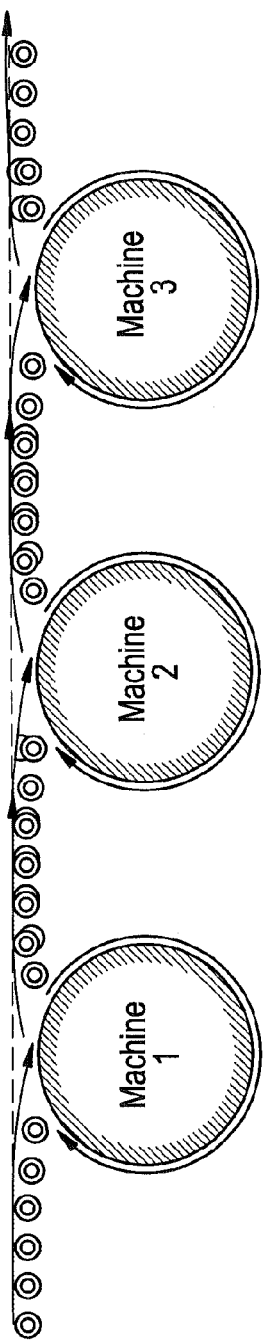

FIG. 23C illustrates a plurality of cylinders Machine1, Machine2, Machine 3 arranged serially. Although FIG. 23C only illustrates three cylinders, a similar arrangement may include any number of cylinders.

Referring to FIG. 23C, each cylinder in FIG. 23C may be the same or substantially the same as the cylinder shown in FIG. 23B, and is capable of passing and capturing a workpiece. Using the arrangement shown in FIG. 23C, the total throughput may be correlated to the number of cascaded cylinders. For example, the more cylinders, the higher the total throughput. Any workpiece may be sent to any of the machines, where the workpiece is processed and then sent back into the material flow on the processing track. This provides improved flexibility for utilizing the combined capacity of the three pieces of equipment. The cylinders may also be three different types of equipment, or may be used for sorting or changing the order between the workpieces.

Because workpieces may be processed and/or the workflow of the workpieces changed using a cylinder, more compact processing units such as the one shown in FIG. 24 may be realized.

FIG. 24 shows an example processing system including a plurality of cylinders discussed above with regard to FIGS. 23A-23C.

Referring to FIG. 24, workpieces enter from the left (e.g., provided from a stocker, which is not shown). The workpieces are coated with a photoresist and baked at coating station 800. After being coated and baked, the workpieces are exposed at exposure station 802 and developed at developer 804. After development the resultant resist pattern on the workpieces are inspected by inspection station 808. If the resist pattern fails inspection, the workpiece is stripped at strip station 810, and returned to the coating station 800.

Still referring to FIG. 24, if the resist pattern passes inspection, the workpiece is etched at etching station 806 and inspected again at inspection station 812. If the workpieces pass inspection or have repairable defects, the workpieces are output to the stocker or a repair station accordingly. If the workpiece fails inspection (e.g., the workpiece is irreparable), the workpieces are output to scrap and discarded.

FIG. 25A shows an example horizontal orientation of a cylinder.

FIG. 25B shows an example vertical orientation of a cylinder.

When loading the cylinder horizontally, as in FIG. 25A, a workpiece is taken from a conveyor belt. When loading the cylinder vertically, as in FIG. 25B, the cylinder is loaded from a guide rail system.

When loaded horizontally, the workpiece may be kept in place by gravitational force. In addition to the gravitational force, horizontally loaded cylinders may be held in place by a pusher to force the edge of the workpiece down on the cylinder to latch the workpiece in place. The workpiece may be held in place by a vacuum to ensure that the surface follows the surface of the cylinder closely.

At the ends of the workpiece the spring force of the workpiece may be the primary force. Therefore the end of their workpiece is fastened more securely to the cylinder. A latch controlled to capture or release the edge of the workpiece may be used. When the edge is released for unloading the pusher takes over the force and follows the end of the workpiece while being unrolled. The pusher may be contact or noncontact type.

Figure 26:
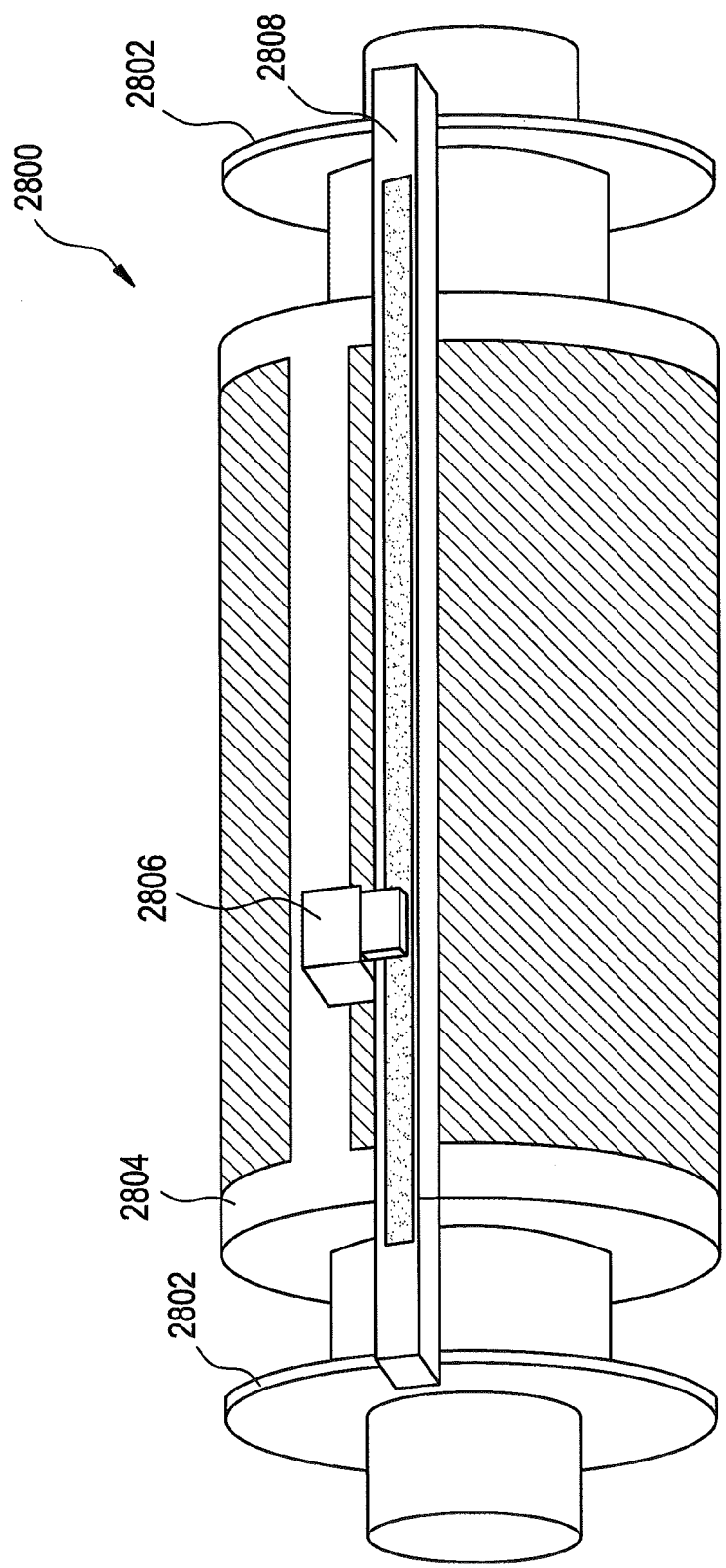
FIG. 26 shows an example apparatus for establishing a coordinate system on a cylinder stage.

FIG. 26 shows an example apparatus 2800 for establishing a coordinate system on a cylinder.

Referring to FIG. 26, angle encoder discs 2802 rotate with the cylinder 2804 and a linear encoder 2806 is arranged along the tool axis. The toolbar 2808 references the angle encoder discs 2802 and provides the scale used by the tool. The angle encoders 2802 may suffer from errors, such as, uncertainty in the position of the rotation axis, non-linearity in the angle codes and/or noise.

FIG. 27A illustrates in more detail how a command to move to standardized workpiece coordinates x and y may be converted to a command for the stage and tool to move to specific tool and stage coordinates. Standardized (or abstracted) workpiece coordinates are the coordinates on the workpiece when, for example, the workpiece is in a desired or predefined state (e.g., unstressed with flat front side at a uniform temperature of about 22.00° C.). Furthermore the standardized state may be at a specific time, for example, after the substrate has been processed (with possible distortion, warpage and shrinkage) and will be matched to another panel, for example, a transistor array for a color filter. Even though the workpiece may be neither stress-free, flat nor in the finished state at the specified temperature, there may still be a one-to-one relation between points on the surface of the workpiece and points on the workpiece in the standardized state.

To draw a cross that will appear at a particular x,y coordinate on the finished, tempered, flat and stress-free workpiece there is, at every point in time, a point at which the cross should be drawn. The machine for drawing the cross may be controlled by tool and stage coordinates. FIG. 27A shows how the stage and tool coordinates for an abstracted coordinate may be located.

Referring to FIG. 27A, after moving the tool to a standard workpiece x,y coordinate point at S3600D, the standardized coordinate is corrected for a scale error and for the scale error resulting from the temperature difference between the current point in time and the standardized state at S3602D. At S3604D, systematic distortions, such as shrinkage due to high-temperature annealing, are corrected.

At S3606D, clamping and bending distortion are further corrected. For example, in this context bending may be dilation of the outer surface due to the bending and clamping or other known distortions (e.g., compression due to holding forces). In at least one example embodiment, it may be relatively difficult to attach the thinner workpiece to the stage with proper (e.g., perfect) alignment. Thus, it may be easier to attach the workpiece to the stage and then measure the mis-alignment to the stage. In this example, the system may have alignment sensors to measure the position of the workpiece in machine coordinates. The measured mis-alignment may be applied in the software to the coordinate system of the workpiece.

Still referring to FIG. 27A, at S3608D the corrected coordinates are further corrected for misalignment to the stage. At this point, the workpiece coordinates are converted to the coordinates or control parameters for the stage and the tool at S3610D. In an example with a cylindrical stage and angle encoders on the axis, the conversion at S3610D includes converting an angle and a tool distance along the axis of the cylinder to cylindrical coordinates. If the tool has internal coordinates like a manipulator, a camera or an SLM, these internal coordinates may also be calculated.

At S3612D, the tool offset is applied to the coordinates. If more than one tool or more than one toolbar is used, the tool offsets are measured for each tool and stored to be used for this correction. In at least one example embodiment, the offset of each tool is measured against a common reference suitable to the nature of the tools. If the tools are cameras or detectors, for example, the common reference may be a common fiducial. If the tools are exposure tools with light beams, the common reference may be, for example, a camera, a detector or the like. For some types of tools where a reference is not readily at hand or not practical (e.g., a micro-dispenser), auxiliary alignment systems (e.g., auxiliary detectors, camera, light sources, etc.) may be used. The tool and stage is then moved according to the converted and corrected stage and tool coordinates at S3614D.

FIG. 27B shows a method for converting tool and stage coordinates into standard workpiece coordinates. In other words, the method shown in FIG. 27B is the reverse of the method shown in FIG. 27A. As shown, for example, a specific set of stage and tool coordinates are recorded and converted to abstract workpiece coordinates. Although the methods shown in each of FIGS. 27A and 27B are shown with respect to a particular order, this is for example purposes only. The sequence between steps of the methods shown in these figures may be reversed, one or more steps may be skipped and/or two or more steps may be combined into one operation.

Referring to FIG. 27B, at S3614E, stage and tool coordinates are input, and tool offset is corrected at S3612E. The tool and stage coordinates are converted into standard workpiece coordinates at S3610E. At S3608E, the corrected coordinates are further corrected for mis-alignment of the stage.

At S3606E, clamping and bending distortion are further corrected. At S3604E, any known systematic distortions are corrected. The standardized coordinate is corrected for a scale error and for the scale error resulting from the temperature difference between the current point in time and the standardized state at S3602E. The standard workpiece (x,y) coordinate points are output at S3600E.

Figure 28:
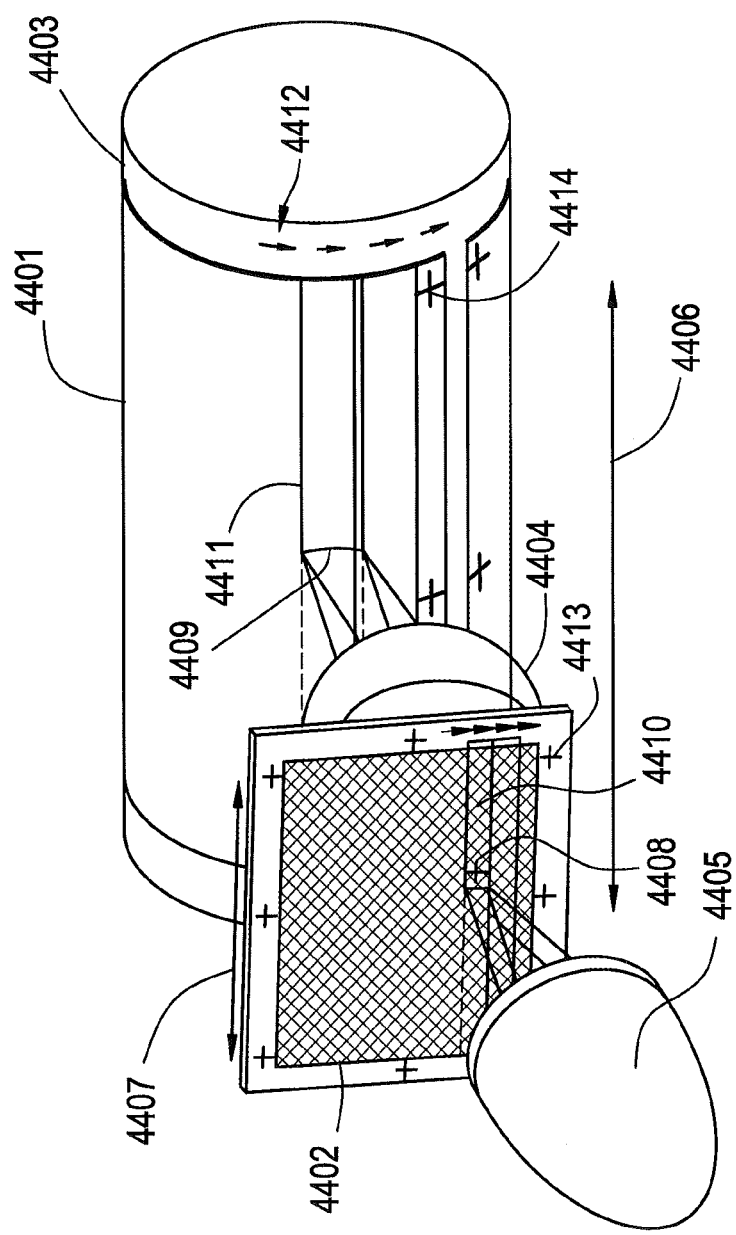
FIG. 28 shows a more detailed view of an example projection system including a cylindrical stage.

FIG. 28 shows a more detailed view of the projection system according to an example embodiment. The drawn stripe may be about 140 mm wide on the workpiece and the scanning speed along the tool axis may be about 1 m/s. There is an overlap of about 20 mm between stripes. As a result, the throughput is about 0.1 $m^2$/second or about 6 $m^2$ in 60 seconds. The exposed pattern may be distorted to match a known distortion of a previously created pattern on the workpiece, or in anticipation of a distortion that may occur or be later in the process due to patterning, stress, high-temperature processing or matching to a distorted element. Intentional distortion along the tool axis may be created using small changes in the scanning speed of the mask relative to the speed of the projection system. In the tangential direction, for example, small distortions may be created by a small angle movement of the cylinder, by a mechanical offset or tilt of one of the components in the projection system and/or by a small movement of the mask in a direction perpendicular to the scan direction.

The mask may be flat, but the optical field on the cylinder may be curved. The curved field may be corrected in a ring field system, which may be suitable.

Figure 29:
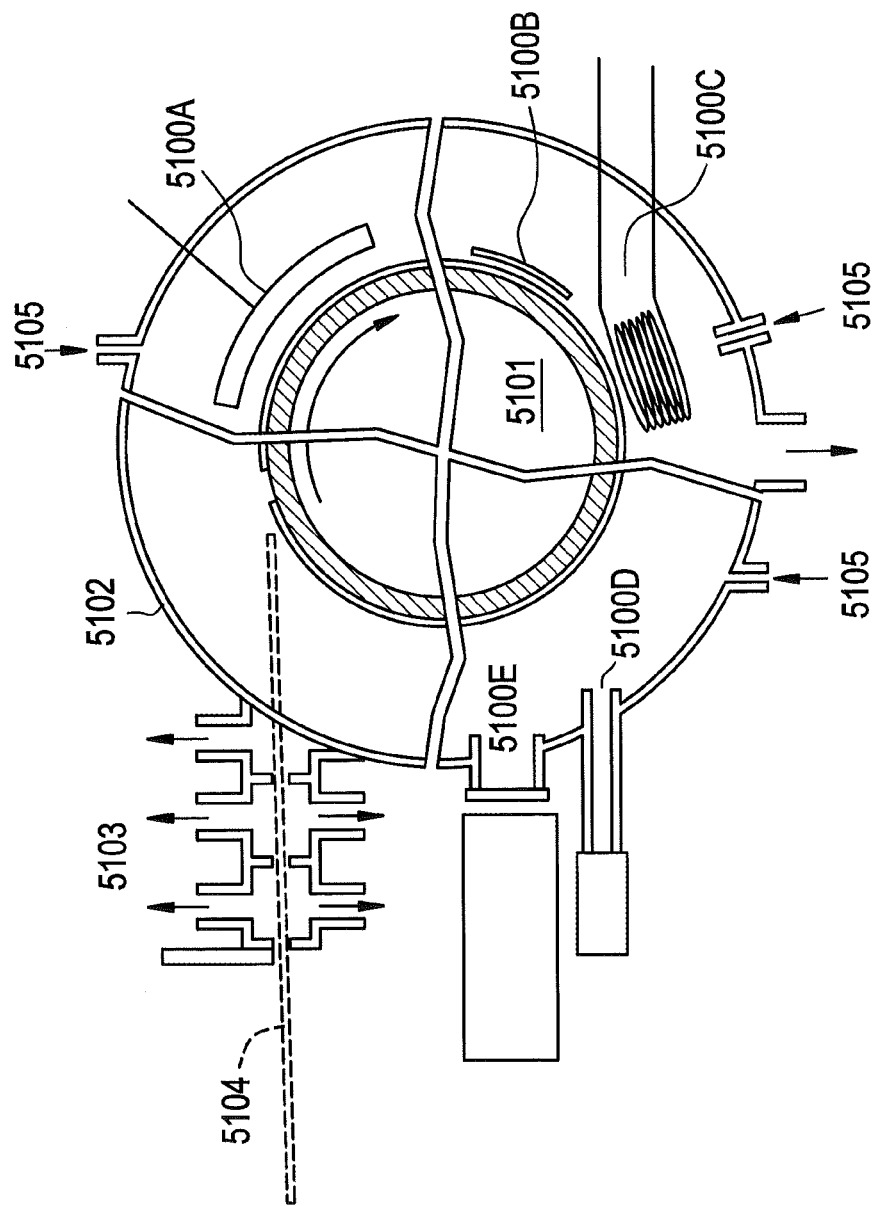
FIG. 29 shows several example vacuum or closed environment processes using a cylindrical stage.

FIG. 29 shows several example vacuum or closed environment processes for forming semiconductor and other devices using a cylindrical stage.

Referring to FIG. 29, the cylinder 5101 is enclosed in a hermetically sealed vessel 5102. The vessel 5102 may be sealed using, for example, a vacuum introduced via access point 5105. Alternatively, the access point 5105 is used to control the atmosphere of the sealed vessel 5102. A load-lock 5103 is differentially pumped so that workpieces 5104 are loaded into the chamber while maintaining the vacuum. After the machine has been loaded, the load-lock 5103 is closed.

Referring still to FIG. 29, within the sealed vessel 5102, the cylindrical stage 5101 is used in a sputtering process 5100A, a plasma etching process 5100B, inductive plasma etching or deposition 5100C, photon, electron, or ion beam rubbing 5100D and/or laser annealing/re-crystallization 5100E. Each of these processes is well-known in the art, and thus, a detailed discussion thereof will be omitted for the sake of brevity. In addition, although only processes 5100A-5100E are discussed herein, many more processes than those shown may be implemented using a similar or substantially similar system. A cylinder or cylindrical stage, according at least some example embodiments, may also be used as an infrastructure for inspection and/or repair.

FIGS. 30, 31A-31C, and 32A-32C illustrate different stages usable in a modular system as shown, for example, in FIG. 21.

Figure 30:
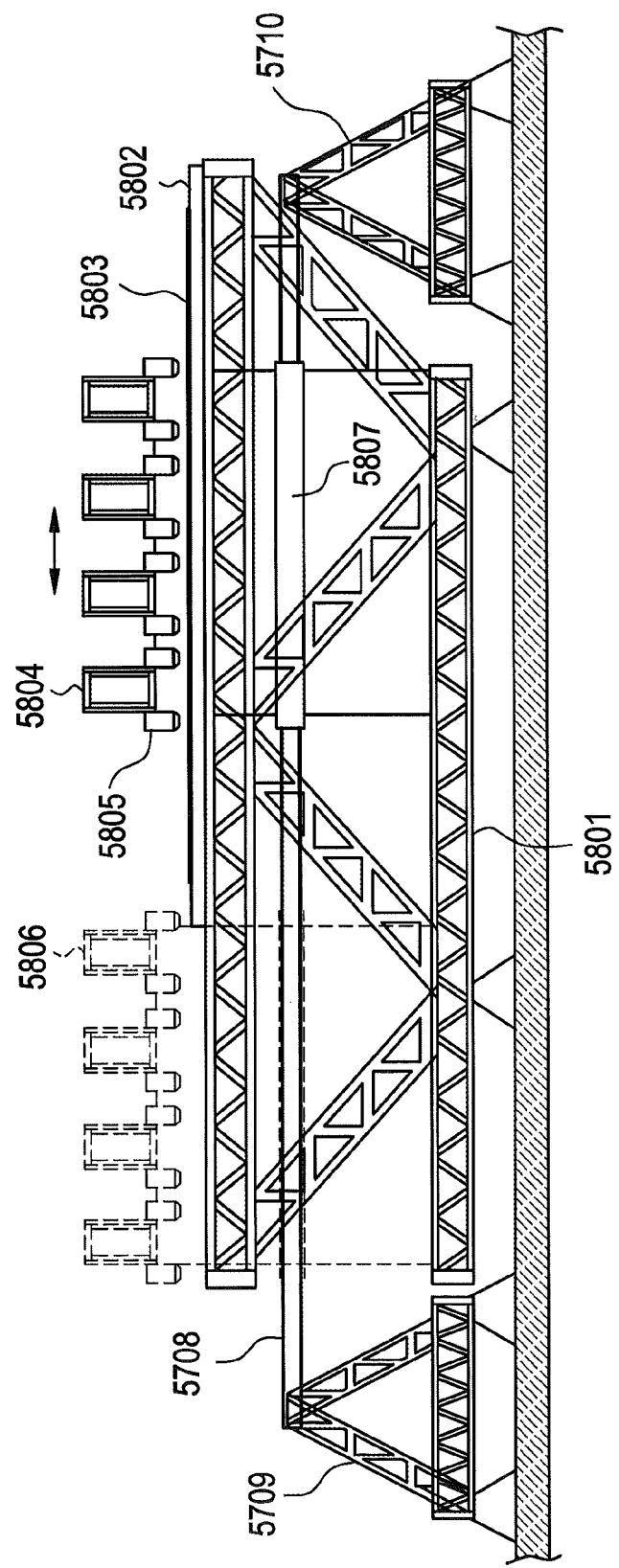
FIG. 30 illustrates an example platform for processing relatively large and substantially flat substrates.

In more detail, FIG. 30 illustrates a flatbed platform. The platform shown in FIG. 30 may be a lightweight frame, shown for example purposes as a truss. However, example embodiments may be built with thin walled tubes that may be temperature controlled by fluid (e.g., air, water and/or gas) flowing within the tubes. The frame may provide a more rigid support for a stationary stage top 5802 supporting the workpiece 5803. At least one toolbar may extend across the stage multiple toolbars are possible and standardized seats, fixtures and connectors, plus infrastructure for the creation of a common coordinate system makes it easier to configure the stage with one or many tool on one or many tool bars. FIG. 30 shows as an example including four toolbars 5804. Each of the toolbars has one or more tools 5805. The tools 5805 are mounted or arranged in a similar or substantially similar manner to that as described above with regard to the cylindrical stage. The number of toolbars 5804 and the tools 5805 attached to each toolbar 5804 may be configured according to the application and/or need for capacity.

FIG. 30 also shows a linear motor 5807 driving the toolbar assembly and the stator of the linear motor is attached to a rod 5708 connected between two supports 5709, 5710 standing separately on the floor. In another example embodiment, a freely moving counter mass (not shown) may be connected to the stator so that neither part of the linear motor is connected to the ground. The linear motor moves the toolbar assembly and the counter mass by applying a force there between, while keeping a common, stationary center of gravity. A separate system including a motor (not shown) applying a weak force between the ground and the counter mass keeps the counter mass centered within a range of movement.

Figure 20A:
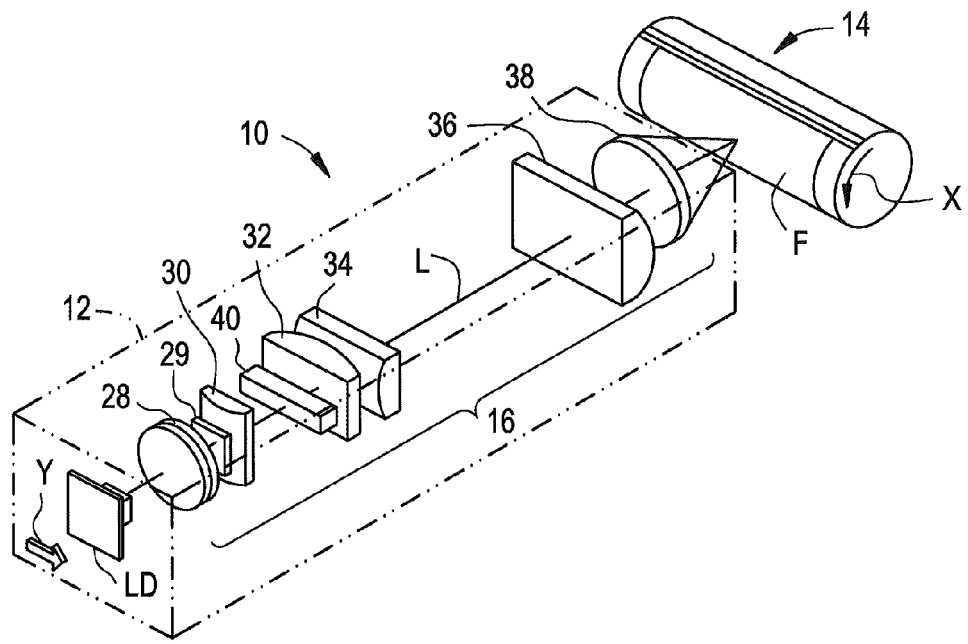
FIGS. 20A and 20B illustrate conventional processing systems having a cylinder stage.
Figure 20B:
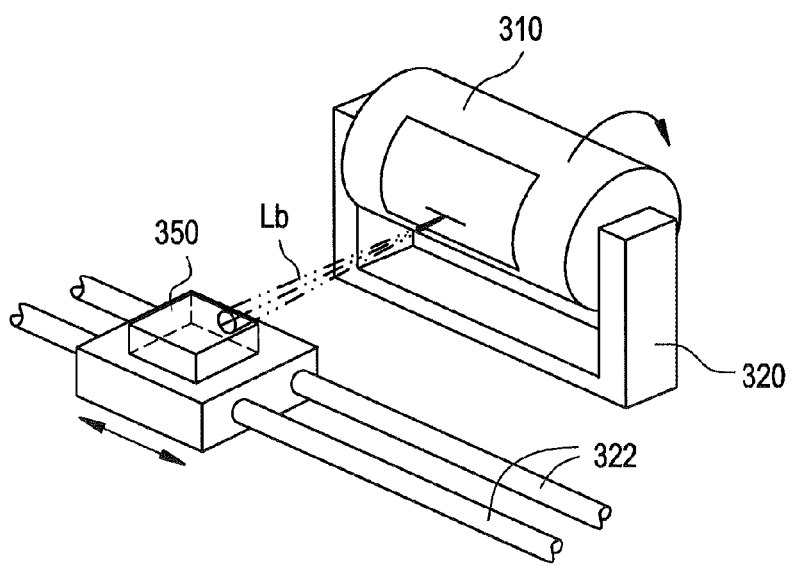

FIGS. 20A and 20B show examples of conventional drum scanners. In this example, the workpieces may be a flexible sheet such as plastic film or paper. In FIG. 20B the substrate is a thin glass sheet intended for making display devices by thermal transfer, in particular for colour filter production.

The optical writing units in FIGS. 20A and 20B may be, for example, single point laser diodes. The laser diodes may be of any commercial available wavelength such as blue, red, violet, etc. The power of a laser diode may be, for example, about 5 mW to about 65 mW, inclusive for single mode, and about 5 mW to about 300 mW, inclusive for multimode diodes. An electro-optical efficiency of a laser diode may be, for example, about 13%. The laser diodes may act as an optical power source and a modulator, for example, simultaneously. Alternatively, the optical writing units may be SLMs.

The axis of rotation of the rotor scanner may be vertical, horizontal, or any angle there between. The vertical axis arrangement may have a constant, or substantially constant, acceleration of the optical writing units at all times. The horizontal axis arrangement may handle the workpiece more efficiently and/or with less effort absent the need to counteract forces of gravity.

Figure 31A:
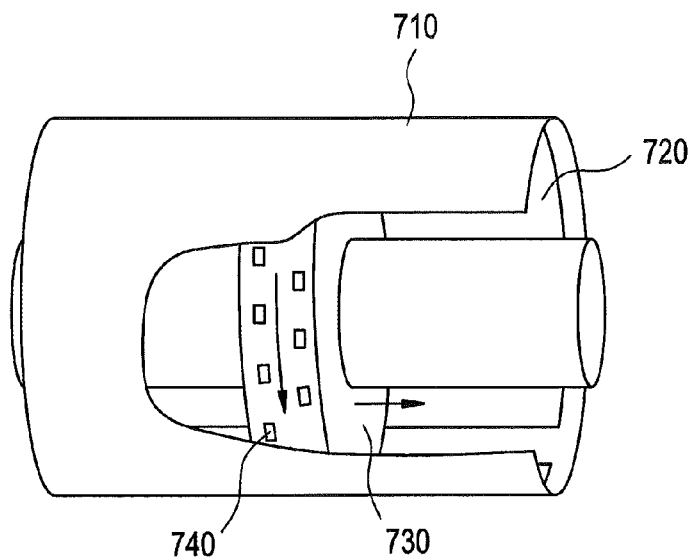
FIGS. 31A-31C illustrate different example implementations and orientations of a disc-type writing apparatus.
Figure 31B:
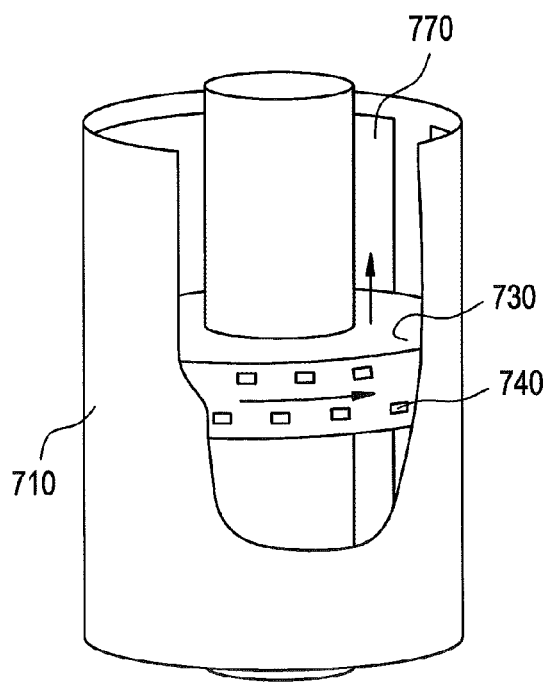
Figure 31C:
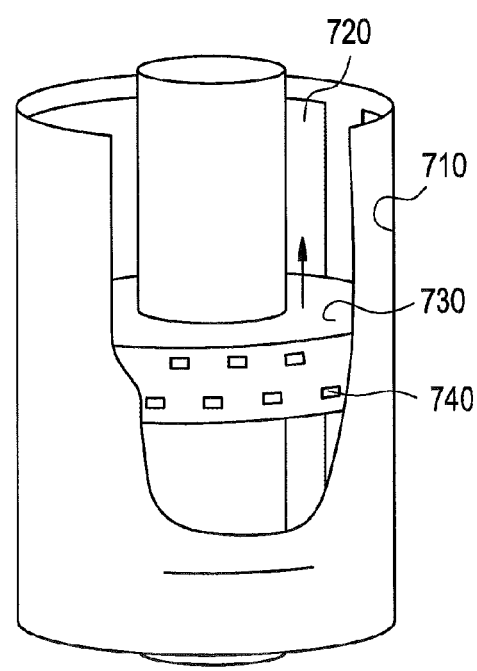

FIGS. 31A-31C illustrate different implementations and orientations of a helix writing apparatus including a disc rotor scanner. The disc rotor scanner discussed below with regard to FIGS. 31A-31C may be the same or substantially the same as the disc rotor scanner shown, for example, in U.S. patent application Ser. No. 11/711,895. Therefore, a detailed discussion will be omitted for the sake of brevity.

Referring to FIG. 31A, the writing apparatus includes a holder (e.g., a tubular holder) 710 and a disc rotor scanner 730. The disc rotor scanner 730 includes a plurality of optical writing units 740.

The workpiece 720 is arranged inside the workpiece holder 710. A central axis of the holder 710 is arranged horizontally in this example. The holder 710 is kept at a fixed position, while the disc rotor scanner 730 rotates and/or moves in a direction parallel or substantially parallel to the central axis. The optical writing units 740 are arranged on an outer edge of the disc rotor scanner 730 in at least one row, but are shown as including two rows in FIG. 31A. The optical writing units 740 face an inner surface of the workpiece holder 710.

Referring to FIG. 31B, the central axis of the workpiece holder 710 is arranged vertically. The workpiece 770 is arranged inside the holder 710 as discussed above with regard to FIG. 31A. The workpiece 770 is fixed in the holder 710 by forces, which flatten, or substantially flatten the workpiece 770. Alternatively, the workpiece 770 is fixed to the holder 710 by vacuum nozzles. In this example, the workpiece 770 is fixed in the holder 710 by removing the air between the workpiece 770 and the holder 710. The workpiece 770 and holder 710 is fixed while the disc rotor scanner 730 rotates and/or moves vertically (e.g., upward and/or downward).

Referring to FIG. 31C, the writing apparatus of FIG. 31C is similar or substantially similar to the writing apparatus discussed above with regard to FIG. 31B. However, in the writing apparatus of FIG. 31C, the workpiece 720 and the holder 710 rotate while the disc rotor scanner 730 moves in a vertical direction (e.g., upwards and/or downwards).

Figure 32A:
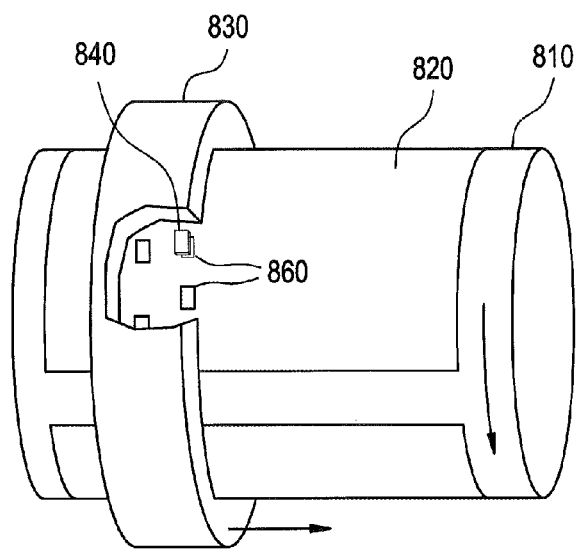
FIGS. 32A-32C illustrate different example implementations and orientations of a ring-type writing apparatus.
Figure 32B:
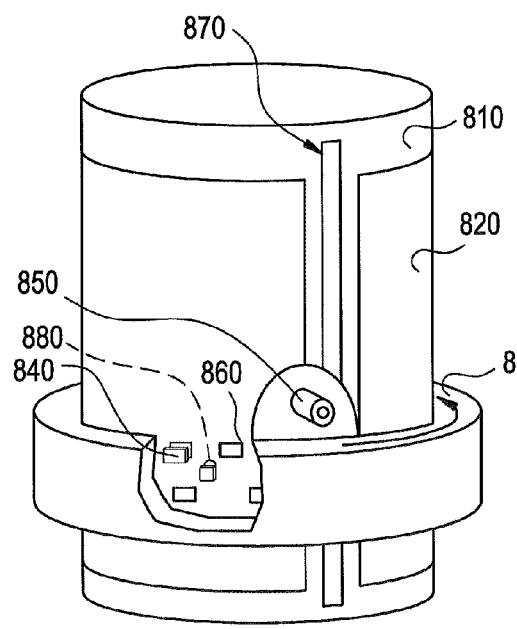
Figure 32C:
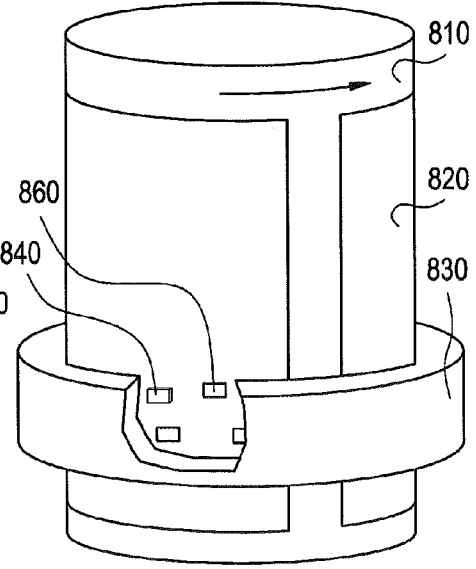

FIGS. 32A-32C also illustrate helix writing apparatuses.

Referring to FIG. 32A, the writing apparatus includes a holder (e.g., a cylindrical stage or tube formed holder) 810, a rotor scanner 830 and a plurality of optical writing units 840. A workpiece 820 is arranged on the outside of the holder 810. The workpiece 820 is fixed on the holder 810 by vacuum nozzles (identified as 850 in FIG. 32B). The rotor scanner 830 rotates outside the workpiece holder 810 and optical writing units 840 emit radiation in a radial direction inward toward the central axis of the holder 810. The optical writing units 840 may be, for example, single point laser diodes, multi-point laser diodes or spatial light modulators (SLMs). The spatial light modulators (SLMs) may be at least partially transmissive SLMs capable of creating stamps or patterns 860 on the workpiece 820. As shown in FIG. 32A, the central axis of the workpiece holder 810 may be oriented horizontally.

Still referring to FIG. 32A, in operation the ring rotor scanner 830 rotates around the central axis of the holder 810 and moves in an axial direction relative to the holder 810 and parallel to the central axis of the holder 810. In addition, the holder 810 rotates around its central axis in a rotational direction opposite to that of the ring rotor scanner 830.

FIG. 32B shows an example including a stationary cylindrical holder 810 and a rotating writing head 830. The stationary cylindrical holder 810 is capable of holding a wrapped workpiece 820.

Referring to FIG. 32B, the holder 810 includes a slit 870 in which a calibration sensor is arranged. The calibration sensor may be movable or fixed. The writing head 830 includes a plurality of optical writing units 840 configured to create patterns 860 on the workpiece 820. An alignment camera 880 captures an existing pattern on the workpiece 820 such that a written pattern is aligned with higher accuracy, thereby increasing overlay precision.

FIG. 32C shows an example helix writing apparatus including a rotating cylindrical holder 810 holding a wrapped workpiece 820 and a stationary writing head 830. The writing head 830 includes a plurality of optical writing units 840 configured to create patterns 860 on the workpiece 820. The optical writing units 840 of FIG. 32C may be the same or substantially the same as the optical writing units 840 of FIG. 32A.

Figure 33:
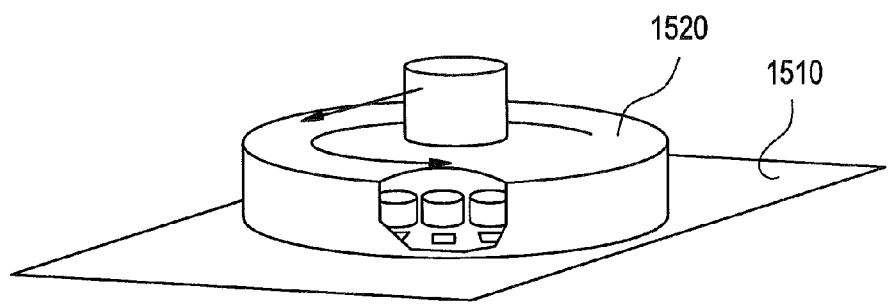
FIG. 33 is a perspective view of an example writing apparatus.

FIG. 33 is a perspective view of a rotor scanner for patterning a flat or substantially flat workpiece.

Referring to FIG. 33, the rotor scanner 1520 includes a plurality of optical writing units (not shown) arranged on a flat portion (e.g., a top and/or bottom surface) of the rotor scanner 1520. The plurality of optical writing units are arranged such that they emit electromagnetic in an axial direction relative to the rotor scanner 1520. In one example, the optical writing units may be arranged around the outer edge of the bottom of the rotor scanner 1520. As shown, the rotor scanner 1520 rotates and/or moves along the surface of a workpiece 1510. The width of the rotor scanner 1520 covers the width of the workpiece 1510. In example embodiments, the rotor scanner 1520 scans the workpiece 1510 in a varying direction, and forms a relatively shallow run across the workpiece at an angle such that the arc is not tangent to 0, 45 or 90 degrees. This geometry may be used with thicker and/or non-bendable masks.

Figure 34:
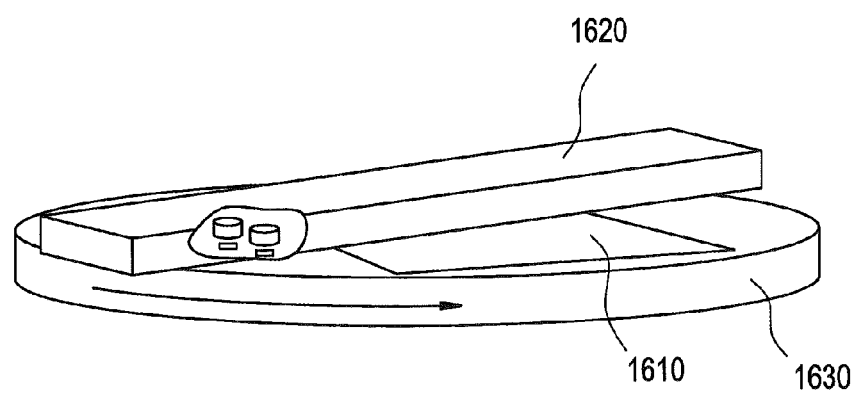
FIG. 34 illustrates another example writing apparatus.

FIG. 34 is a perspective view of another writing apparatus.

Referring to FIG. 34, the writing apparatus includes a circular stage 1630 capable of holding a workpiece 1610. A writing head 1620 is arranged so as to span at least the diameter of the circular stage 1630. The writing head 1620 includes a plurality of optical writing units (not shown) arranged on a surface portion of the writing head, such that electromagnetic radiation emitted by the optical writing heads impinges on the workpiece 1610 during writing.

In example operation, the circular stage 1630, and thus, the workpiece 1610 rotate while the writing head 1620 moves perpendicular to the rotational axis of the circular stage 1610.

Figure 35:
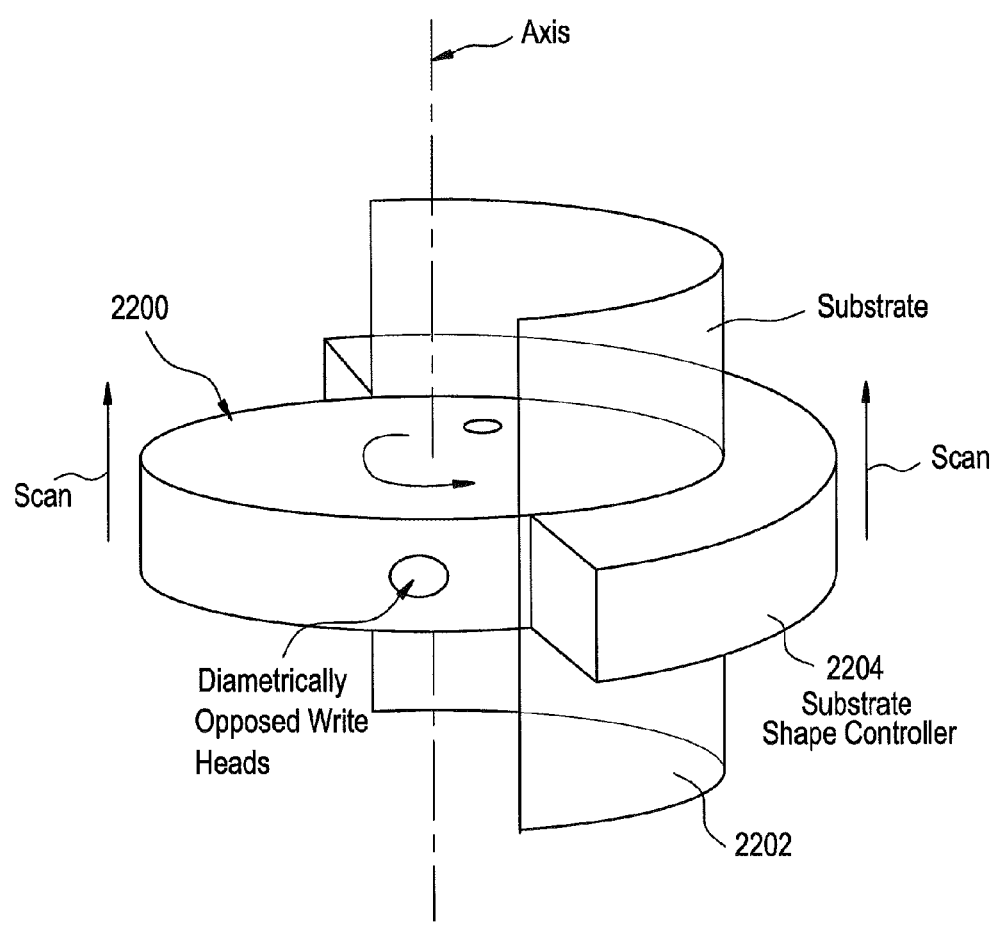
FIG. 35 illustrates yet another example writing apparatus.

FIG. 35 illustrates another writing apparatus. As shown, the writing apparatus includes a rotor scanner 2200 for generating a pattern on a workpiece 2202. The example embodiment shown in FIG. 35 is similar or substantially similar to the example embodiment shown in, for example, FIGS. 31A, 31B and/or 31C, except that the example embodiment shown in FIG. 35 further includes a workpiece shape controller 2204. The workpiece shape controller 2204 scans in the same or substantially the same direction as the rotor scanner 2200. In at least one example embodiment, the workpiece shape controller 2204 scans the workpiece 2202 such that the workpiece shape controller 2204 and the rotor scanner 2200 stay in constant or substantially constant horizontal alignment.

The foregoing description has been provided for purposes of illustration and description. It is not intended to be exhaustive. Individual elements or features of a particular example embodiment are generally not limited to that particular example, but are interchangeable where applicable and can be used in a selected embodiment, even if not specifically shown or described. The same may also be varied in many ways. Such variations are not to be regarded as a departure from example embodiments, and all such modifications are intended to be included within the scope of the example embodiments described herein.

What is claimed is:

1. A pattern generator comprising:
   a stage;
   a workpiece arranged on the stage;
   a calibration plate on one of the stage and the workpiece;
   a writing tool configured to provide a writing optical beam for generating a pattern on the workpiece arranged on the stage; and
   an alignment system configured to determine a correlation between the position of the writing optical beam of the writing tool and the coordinate system of the calibration plate;
   wherein the calibration plate includes,
      a plurality of horizontal reflective patterns arranged to match a one-dimensional line image pattern of an optical beam impinging on the calibration plate, the plurality of horizontal reflective patterns being configured to match the pattern of the impinging optical beam to produce an optical correlation signal for measuring y-scale and y-offset of the writing optical beam, and
      a plurality of sets of vertical reflective bars having a set of slanted reflective bars interlaced between the vertical reflective bars, the plurality of sets of vertical reflective bars being configured to match the one-dimensional line image pattern of the impinging optical beam to produce an optical correlation signal for measuring x-scale and x-offset of the writing optical beam, and the at least one set of slanted reflective bars being arranged to match the one-dimensional line image pattern of the optical beam impinging in a single sweep over the calibration plate to produce an optical correlation signal for measuring x- and y-positions of the writing optical beam.

2. The pattern generator of claim 1, wherein the alignment system is configured to determine the correlation while the writing tool is generating the pattern on the workpiece, and wherein the pattern generator is configured to perform real-time alignment of the pattern generated on the workpiece based on the correlation between the coordinate system of the writing tool and the coordinate system of the calibration plate.

3. The pattern generator of claim 1, wherein the correlation between the coordinate system of the writing tool and the coordinate system of the calibration plate is determined at least partly prior to generating the pattern on the workpiece.

4. The pattern generator of claim 1, wherein the alignment system is a separate measurement system configured to emit a separate optical beam from the writing optical beam which is including a one-dimensional pattern matching the reflective patterns on the calibration plate, and wherein the optical beam emitted by the measurement system is further configured to impinge on, and be reflected by, the reflective patterns of the calibration plate to produce the optical correlation signals used for determining the correlation between the coordinate system of the writing tool and the coordinate system of the calibration plate.

5. The pattern generator of claim 1, wherein the correlation between the coordinate system of the writing tool and the coordinate system of the calibration plate is determined at least partly during the generating of the pattern on the workpiece.

6. The pattern generator of claim 1, wherein the correlation between the coordinate system of the writing tool and the coordinate system of the calibration plate is determined at least partly in between strokes of at least one writing unit of the writing tool generating the pattern on the workpiece.

7. The pattern generator of claim 6, wherein the correlation is determined at least partly in between writing sweeps of one rotor arm.

8. The pattern generator of claim 6, wherein the correlation is determined at least partly in between writing sweeps of two separate rotor arms.

9. The pattern generator of claim 1, wherein while generating the pattern on the workpiece, the pattern generator is configured to perform real-time alignment of the pattern based on the correlation between the coordinate system of writing tool and the coordinate system of the calibration plate.

10. The pattern generator of claim 1, wherein the optical beam includes a plurality of ray pencils arranged in the one-dimensional pattern matching the reflective patterns on the calibration plate.

11. The pattern generator of claim 1, wherein the optical beam impinging on the reflective pattern is a line image in form of an spatial light modulator (SLM) line image.

12. The pattern generator of claim 1, further comprising:
at least one optical detector configured to sample the reflected optical beam.

13. The pattern generator of claim 1, wherein the reflective pattern on the calibration plate is configured to match a line image of the impinging optical beam in order to provide a single peak in a resulting correlation signal.

14. The pattern generator of claim 13, wherein the at least one set of slanted reflective bars is configured according to a Barker or Barker-like coding scheme in order to provide the single peak in the resulting correlation signal.

15. The pattern generator of claim 1, wherein the optical beam includes a set of ray pencils arranged in a one-dimensional pattern.

16. The pattern generator of claim 1, wherein the calibration plate further comprises:
a plurality of diffuse pads for calibrating focus sensors by measuring a surface topology of the calibration plate;
a chirped raster for calibration of focus by measuring a modulation of the reflected optical beam;
a plurality of verification pads for verifying a calibration and verification of timing of pattern exposure;
a plurality of lines arranged in a fan-like pattern, for measurement of the angular orientation of the calibration plate; and
a plurality of offset calibration areas for calibrating a timing offset of the calibration plate.

17. The pattern generator of claim 1, wherein the plurality of slanted reflective bars and the plurality of sets of vertical reflective bars are interlaced along a trajectory traversed by the optical beam.

18. The pattern generator of claim 1, wherein the writing tool is a rotor including at least one rotor arm, the system further including,
a laser source configured to emit the optical beam,
a rotating prism configured to direct the optical beam to the at least one rotor arm, and
a reflector configured to reflect the optical signal toward the calibration plate.

19. The pattern generator of claim 1, wherein the stage is a cylindrical stage.

20. The pattern generator of claim 1, wherein the writing tool is a helix writing tool.

21. The pattern generator of claim 1, wherein the pattern is generated on the workpiece by roll-to-roll printing.

22. The pattern generator of claim 1, wherein separate optical beams are used for generating the pattern on the workpiece and for performing real-time alignment of the pattern on the workpiece.

* * * * *